United States Patent [19]

Srinivasagopalan et al.

[11] Patent Number: 4,807,230

[45] Date of Patent: Feb. 21, 1989

[54] FRAME SYNCHRONIZATION

[75] Inventors: Rangarajan Srinivasagopalan, Coral Springs; James D. Pruett, Ft. Lauderdale, both of Fla.

[73] Assignee: Racal Data Communications Inc., Sunrise, Fla.

[21] Appl. No.: 55,805

[22] Filed: May 29, 1987

[51] Int. Cl.[4] ............................................. G06F 11/10
[52] U.S. Cl. .................................... 371/46; 371/42; 371/47; 375/114
[58] Field of Search ................... 371/42, 47, 49, 5, 43, 371/44, 45; 375/114, 116, 118, 88; 370/105, 108, 100

[56] References Cited

U.S. PATENT DOCUMENTS

| | | | |
|---|---|---|---|
| 3,575,554 | 4/1971 | Schmidt | 375/114 |
| 3,576,947 | 5/1971 | Kruger | 375/116 |
| 3,689,697 | 9/1972 | Smith, Jr. | 374/161 R |
| 3,742,139 | 6/1973 | Boehly et al. | 375/118 |
| 3,943,288 | 3/1976 | Ragsdale | 178/67 |
| 4,016,368 | 4/1977 | Apple, Jr. | 370/105 |
| 4,077,021 | 2/1978 | Csajka et al. | 332/9 R |
| 4,404,675 | 9/1983 | Karchenski | 371/47 |
| 4,578,800 | 3/1986 | Yasuda et al. | 375/106 |
| 4,581,601 | 4/1986 | Calderbank et al. | 340/347 DD |
| 4,583,236 | 4/1986 | Kromer et al. | 375/17 |
| 4,601,044 | 7/1986 | Kromer, III et al. | 375/17 |
| 4,605,921 | 8/1986 | Riddle | 371/47 |
| 4,641,327 | 2/1987 | Wei | 375/114 |
| 4,680,765 | 7/1987 | Doland | 371/47 |
| 4,686,690 | 8/1987 | Sato | 371/47 |
| 4,713,692 | 12/1987 | Kirkland | 371/47 |

OTHER PUBLICATIONS

G. D. Forney, Jr.; R. G. Gallager; G. R. Lang; F. M. Longstaff and S. U. Qureshi, "Efficient Modulation for Band-Limited Channels," IEEE Journal on Selected Areas in Comm., vol. SAC-2, No. 5, pp. 632-645, Sep., 1984.

Primary Examiner—Michael R. Fleming
Attorney, Agent, or Firm—William A. Newton

[57] ABSTRACT

Disclosed is a modem including a transmitter having a convolutional encoder for transforming each group interval digital data into an expanded bit sequence having symbol-selecting bits and subset-selecting bits forming a plurality of bit groups, with each bit group designating a 2-dimensional subset and the symbol-selecting bits being used to select one 2-dimensional symbol from each of the selected subsets, the transmitter further providing modulation of a carrier signal, and a receiver wherein synchronization of received frames of subset-selecting bits is provided by applying a parity check equation to a plurality of possible received frames of subset-selecting bits.

27 Claims, 13 Drawing Sheets

FIG. 2A

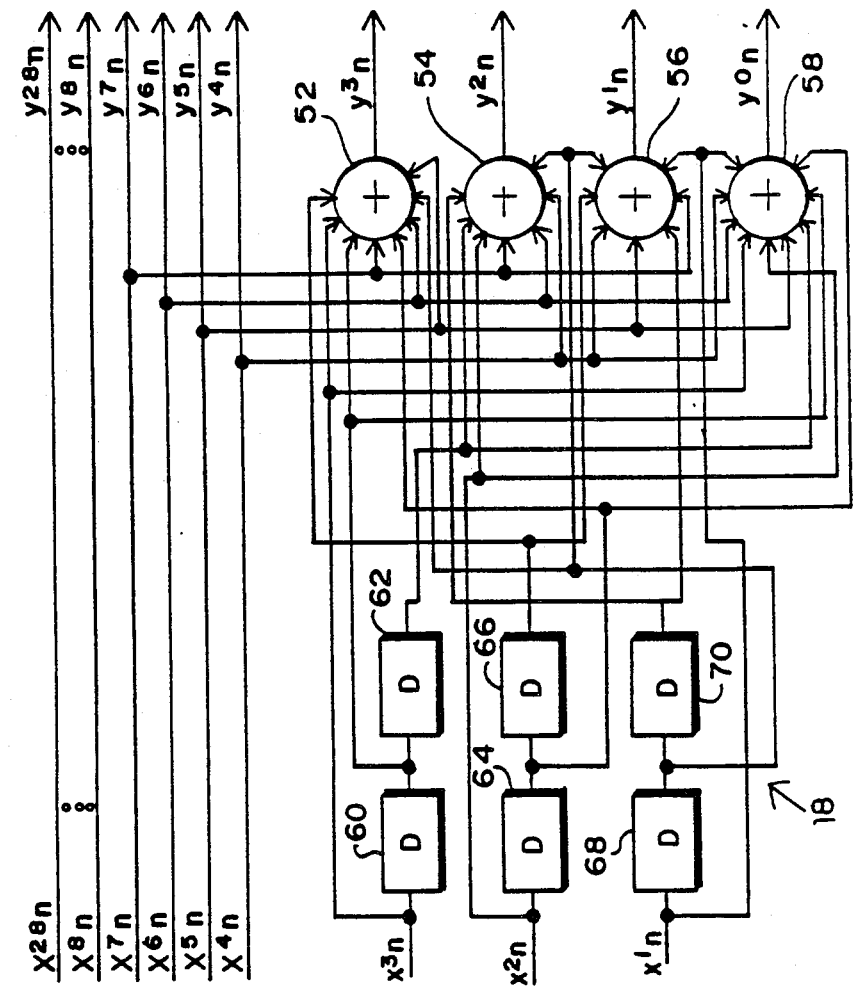
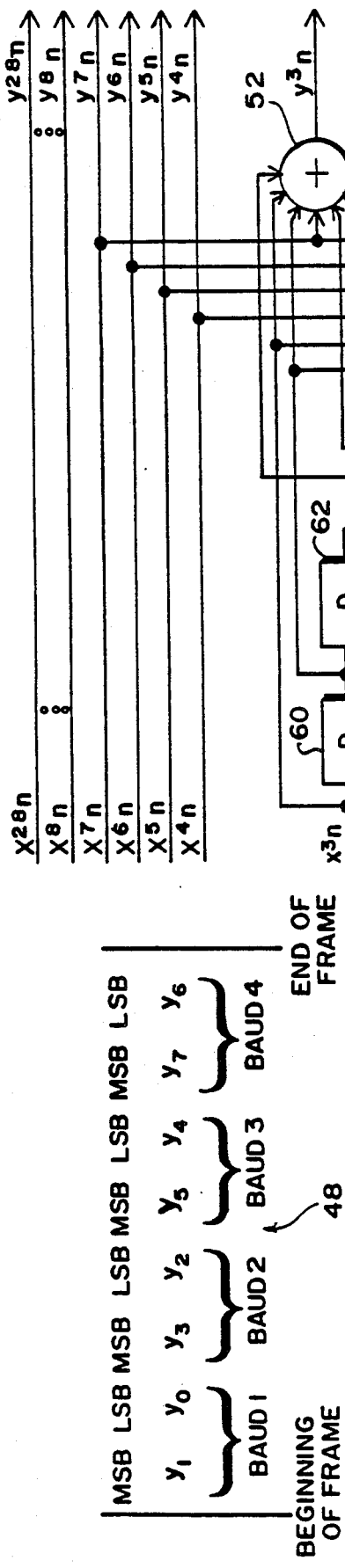

FRAME SYNCHRONIZATION

BACKGROUND

1. Field of the Invention

The present invention relates to transmitting digital data over a band limited channel by using convolutional coding and multidimensional coded modulation.

2. Background Art

U.S. Pat. No. 4,077,021 to Csajka et al. used 2-dimensional coding to improve the performance of the modem against Gaussian noise. In this scheme the signal constellation was partitioned into 2-dimensional subsets. The minimum distance between the points in each subset was chosen to be larger than the minimum distance in the entire constellation. The indices of the subsets were found to be in one to one correspondence with the outputs of certain convolutional encoders. The input bits to the convolutional encoder were divided into two groups. During each baud (symbol interval), the first group of bits was expanded by the convolutional encoder to create subset selecting bits (coded bits) and the second group of bits, i.e., symbol-selecting bits (uncoded bits) was used to select a member of the subset to be transmitted. Although this coding scheme improved the performance of the system against noise, it also doubled the number of points in the signal constellation making the system more susceptible to other impairments. This is mitigated by the use of a multidimensional code, as described in European patent application No. 85300803.5 to Gallagher and U.S. Pat. No. 4,581,601.

The multidimensional encoder is usually a (m, m−1) convolutional encoder (i.e., the encoder produces m output bits for m−1 input bits) and when m is even, then m=2n, where n=2, 3, or 4 for 4, 6 or 8 dimensional coded modulation, respectively. Thus, a portion of the encoder output typically comprises a frame of n pairs of subset-selecting bits (i.e., bit pairs), with one of the bit pairs being indexed to a subset of signal points (symbols) of the constellation for each of n bauds. The symbol-selecting bits are used to designate one symbol from each subset of signals (symbols), as with the 2-dimensional convolutional coding. Thus, the encoding process thereby creates within a group interval n 2-dimensional symbols. The symbols within a group interval can be viewed as defining a 2n-dimensional point (symbol) from an available alphabet of 2n-dimensional symbols in 2n-dimensional space.

In a modem using multidimensional coded modulation, to obtain fractional bits per baud, the signal constellation can be divided into inner points and outer points, with one of the uncoded bits indicating for the n 2-dimensional (symbols) whether there are any outer points and at least one uncoded bit to indicate in which of the n bauds the outer point occurs, as shown in the article entitled "Efficient Modulation for Band limited Channels", G. David Forney et al., IEEE Journal On Selected Areas in Communication, Vol. SAE, 2 Sept., 1984, pp. 632-645.

To accomplish the decoding operations in the receiver for every received frame, the receivers must be properly synchronized with the incoming frames of bits, so that the receiver knows the beginning of each frame. During the beginning of the transmission a synchronizing sequence can be sent. However, whenever there is a loss of signal which is momentary this synchronization is lost. In such a case the receiver has to resynchronize without having to go through answer back sequence.

As is well-known, there are multiport modems which include a time division multiplexer for providing the user with the capability of transmitting more than one synchronous data stream over a single transmission line. A modem at one end of the line will have a plurality of input ports and the modem at the other end of the line will have a corresponding number of output ports. For example, assume a pair of modems with three ports A, B and C. The data transmitted by the data terminal at port A of the near end modem should be received by the data terminal at port A of the far end modem. Similarly, this is true for port B and port C. If the data transmitted from Port A at one end is received by port B or port C at the other end, then the ports are said to be "swapped". During the start up phase of the modem, a synchronization sequence is sent so that data reaches the correct port. This is referred to as multiport synchronization. However, whenever there is a temporary loss of signal for a few seconds and the signal is restored, the digital data should not be swapped. In other words, multiport synchronization should be restored. When the minimum port bit rate is equal to the signaling or baud rate or is an integral submultiple of the baud rate, multiport synchronization can be restored even with temporary loss of line signal. For example, the 16.8K b.p.s. modem with a baud rate of 2.4K bauds per second used in a three port configuration with port A at 4.8K b.p.s., port B at 2.4K b.p.s. and port C at 9.6K b.p.s. is grouped within each baud as:

Bit # 1 2 3 4 5 6 7

Port A A B C C C C

All the information needed for synchronization is contained within each baud. Hence, if line signal is lost for a second or so, the hold over feature which retains baud clock information will prevent port swapping. On the other hand, applicants of the present invention, in designing a high speed modem were faced with the problem of having the baud rate not an integral multiple of the port rates, thereby causing the individual port rates to vary from frame to frame.

SUMMARY OF THE INVENTION

The present invention is implemented in a modem including a transmitter having convolutional encoder for transforming each group interval digital information bits into expanded bit sequence having symbol-selecting bits and a frame of subset-defining bits. Each frame of subset-defining bits is assembled into a plurality of bit groups with each bit group designating a 2-dimensional subset. Consequently, each frame defines a multidimensional symbol subset. The symbol-selecting bits are used to select one 2-dimensional symbol from each 2-dimensional subset and a carrier signal is modulated each baud (symbol interval) the value of the selected symbol. Hence, the 2-dimensional symbols occurring within one group interval define a multidimensional symbol selected from the multidimensional symbol subset.

The invention comprises providing at the modem's receiver synchronization for the received frames of subset-selecting bits (i.e., the bits representing multidimensional symbol subsets) that are needed for the maximum likelihood sequence estimation decoding technique implemented in the receiver. Failure to have synchronization means the proper multidimensional symbol cannot be detected. To accomplish proper synchronization, a slicer operates on a demodulated, baseband signal of 2-dimensional symbols to produce a sequence of received bit groups of subset-selecting bits.

In a first embodiment of the present invention for a single port modem, each group interval, the bit groups are assembled into a plurality of possible candidate frames, with each frame containing the number of bit groups occurring in a group interval. Each possible candidate frame is offset from the next by one bit group so as to generate a number of possible candidate frames that are equal in number to the number of bit groups in the frame. Using a series of frames beginning with each of the possible candidate frames, a parity check equation is repeatedly calculated. This set of calculations is repeated over a predetermined number of group intervals. In the absence of errors, when the possible candidate frame is synchronized with the transmitted frame, then the parity check equation produces a zero output; otherwise, it produces either a one or zero with equal probability. To accommodate any errors, the calculations are repeated over a plurality of group intervals with an average or accumulative value being used to make the decision at the end of the predetermined number of group intervals.

In a second embodiment of the present invention for synchronization with a multiport modem, it is necessary to distinguish between the odd and even numbered frames. This distinction between frames provides each of the channels with a fixed time position to occupy within a master frame and prevents the problem of port misalignment when recovering from a signal drop-out.

For the above-described purpose, at least alternate frames, either even or odd numbered frames, are sent with the symbols rearranged or changed in some manner so as to cause the parity check equation, when applied to the frames of bit groups, i.e., 2-dimensional symbol subsets, to have a non-zero output. If this type of rearrangement or change occurs in at least one of the frames of each master frame, either the even frame or the odd frame, the parity check equation will have the desired non-zero output. Once this modification is introduced in the transmitter, it must be removed in the receiver; however, prior to its removal, the modification can be used for detecting whether there is proper synchronization between transmitted master frames and received master frames, and if there is not, enough information is obtainable to achieve correct synchronization. In general, a moving window is applied to the received master frames in a manner to generate a set of successive candidate frames, each one in the set being offset from the previous one by an additional symbol interval until the last symbol interval in the received frame (which is also one of the candidate frames) becomes the first symbol interval in the last-to-be-generated candidate frame. Only one of these candidate frames is synchronized with the transmitted frame. The candidate master frames define two things. First, it defines the beginning of the bit groups to be used in each calculation of the parity check equation and second, it defines where the above-described modifications should be found among the bit groups, if in fact that particular candidate frame is the one which is synchronized with the transmitted master frame. The calculation of the parity check equation for each of the candidate frames provides an output that determines which candidate frame is synchronized with the transmitted frame.

BRIEF DESCRIPTION OF THE DRAWINGS

Further objects and advantages of the present invention will become apparent as the following description proceeds, taken in conjunction with the accompanying drawings in which:

FIG. 2A shows the upper two quadrants of the complex plane of the signal constellation used with the present invention.

FIG. 4 shows a data packet utilized in the present invention.

FIG. 6 shows a frame of the subset-selecting bits generated by the convolutional encoder.

FIG. 7 shows the structure of the convolutional encoder.

DETAILED DESCRIPTION OF PREFERRED EMBODIMENT

Figure 1:
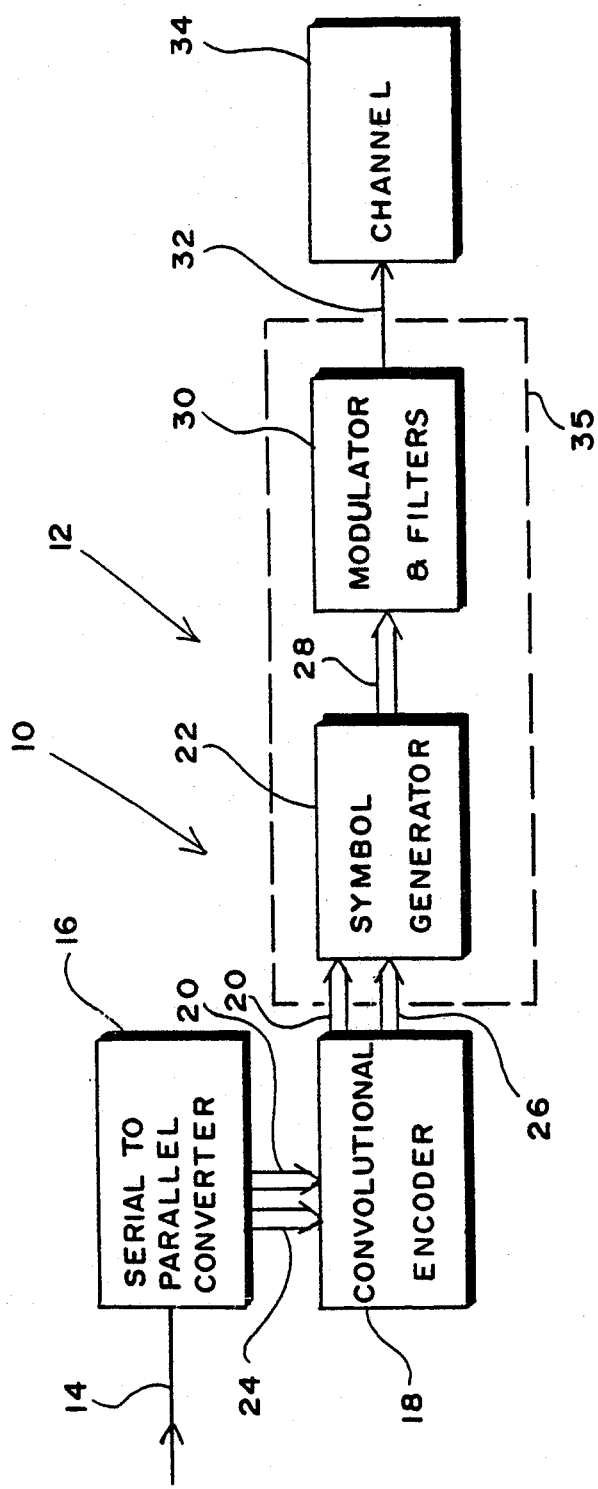
FIG. 1 shows a block diagram of a transmitter of a modem of a first embodiment of the present invention.

Referring to FIG. 1, there is shown a block diagram of the generalized structure of a transmitter 10 of a single port modem 12 in which a first embodiment of the present invention is implemented. In the transmitter 10 an information bit stream 14 is made up of serial digital data from a data source (not shown). From the information bit stream 14, bit sequences of fixed length are taken by a serial to parallel converter 16 to form packets of bits which are passed on to a convolutional encoder 18. A portion of the bits of each packet, symbol-selecting bits 20, are passed through the convolutional encoder 18 to a symbol generator 22. The remaining portion 24 of the bits of the packet are sent to the convolutional encoder 18. The convolutional encoder 18 preferably, but not necessarily, is an encoder which allows for 2n dimensional coded modulation. In the preferred embodiment, for each packet, a portion of the output of the convolutional encoder 18, i.e., subset-selecting bits 26, form a frame of an even number of bits, i.e., the subset-selection bits in a frame consist of 2n bits. In other implementations, the frame can have an odd number of bits. The subset-selecting bits 26 are passed to the symbol generator 22. For each received packet, the subset-selecting bits 26 and symbol-selecting bits 20 form an output of the encoder 18 that will be identified as the expanded bit sequence. The symbol generator 22 typically uses a pair (i.e., bit group) of the 2n subset-selecting bits each baud (i.e., symbol interval/modulation period) to specify one of four subsets into which a symbol constellation is partitioned. The symbol-selecting bits 20 are used by the symbol generator 22 to select a symbol (i.e., signal point in constellation) from each subset. Consequently, each packet from the converter 16 is mapped onto a group of n 2-dimensional symbols in n bauds (one group interval), where n is >1 and defines a multidimensional point (symbol) 28. The multidimensional symbols 28, in a conventional manner, are filtered by bandwidth limiting filters and used to modulate a carrier in modulator and filter means 30 to provide a modulated carrier signal 32 to a band limited channel 34. The symbol generator 22 and modulator and filtering means 30 define a multidimensional coded modulation means 35.

Figure 2A:
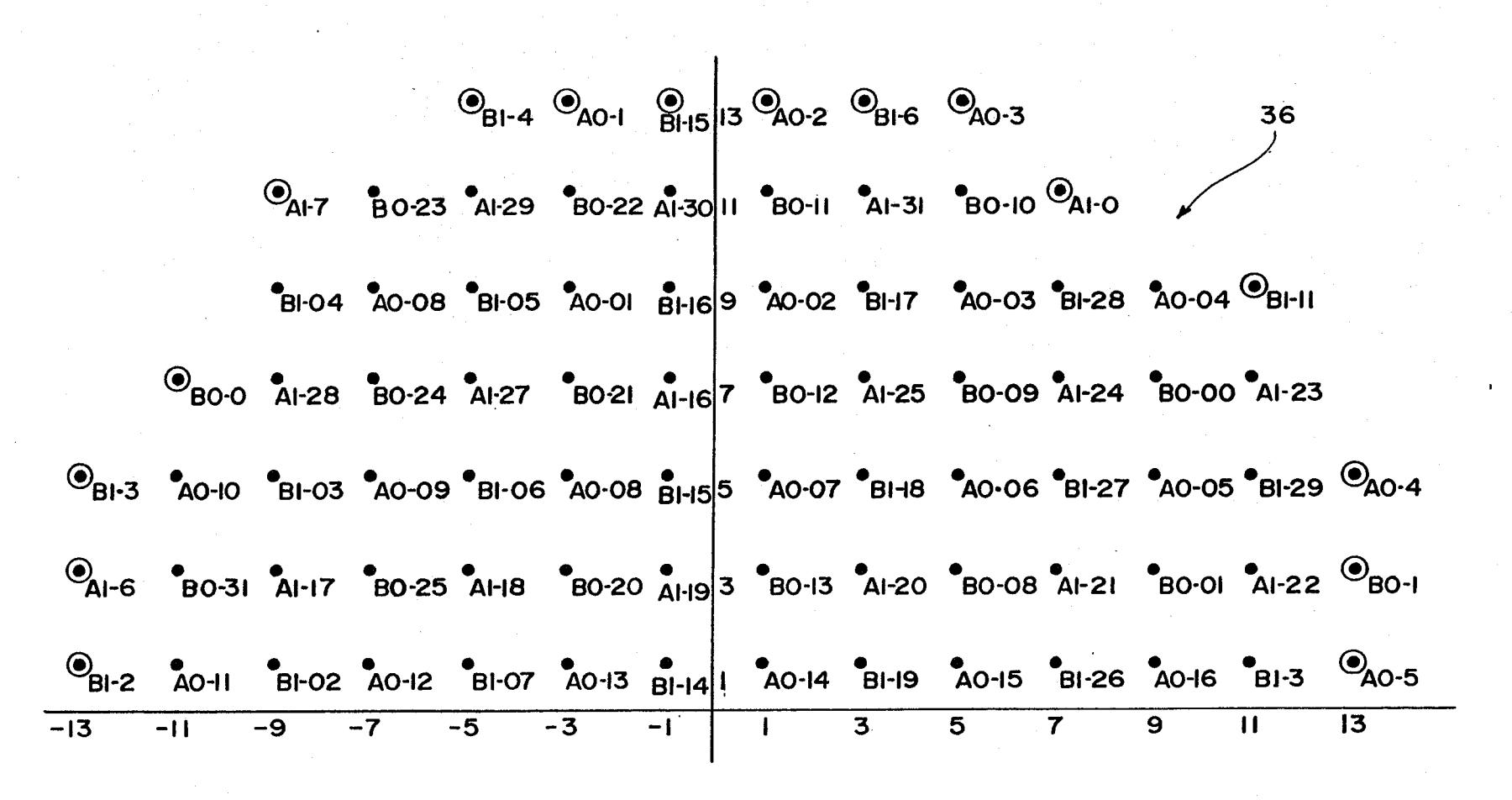
Figure 2B:
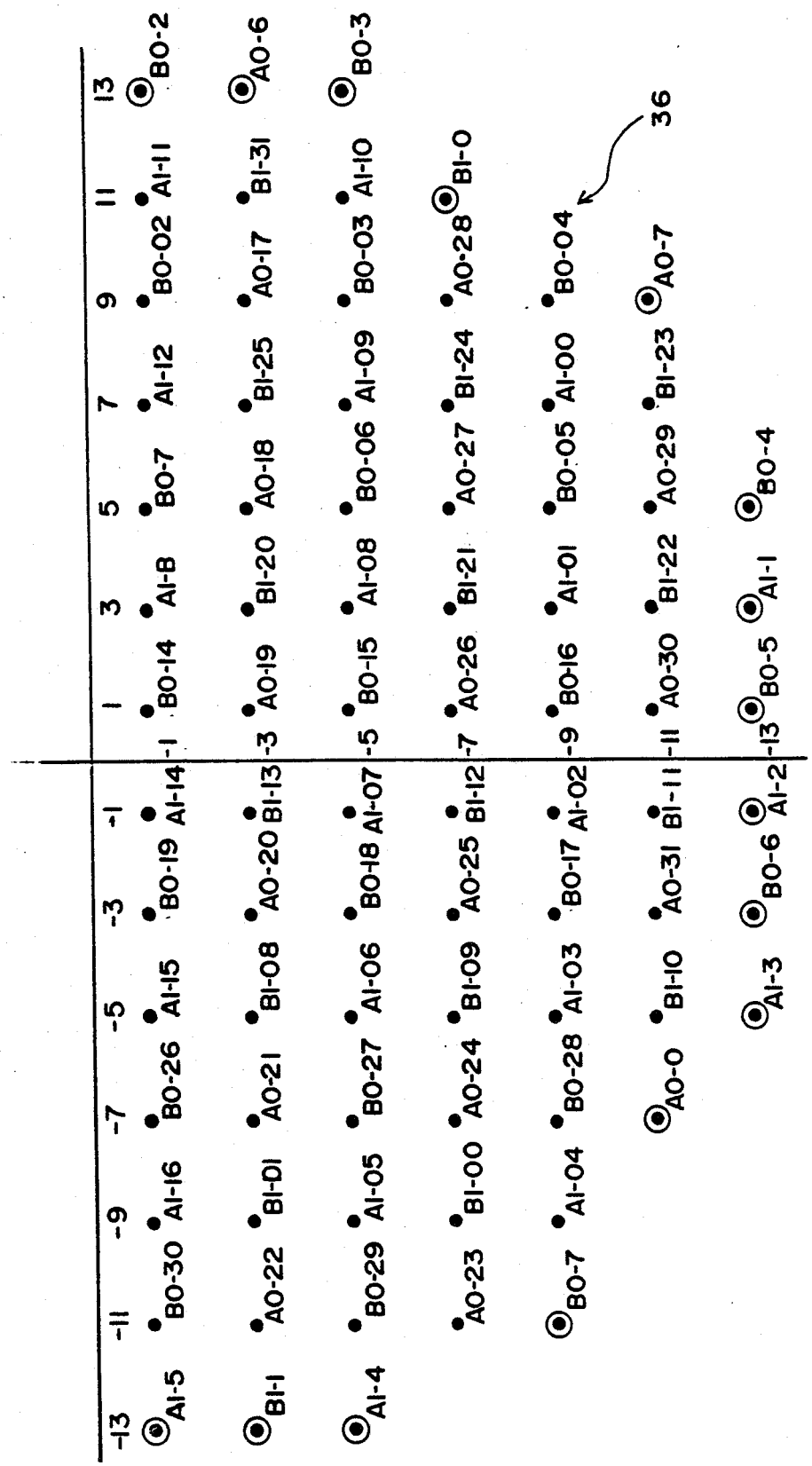
FIG. 2B shows the lower two quadrants of the complex plane of the signal constellation of the present invention.

The specific structure of the transmitter 10 will now be described. The modem 12 in which the present invention is preferably, but not necessarily, implemented transmits data at a rate of 19,200 bits per second. The symbol constellation 36 used by the symbol generator 22 of FIG. 1 is shown in FIGS. 2A and 2B, with upper two quadrants and lower two quadrants of the complex plane of the constellation 36 being shown, respectively, in FIGS. 2A and 2B. For purposes of illustration, the transmitter 10 uses eight dimensional coded modulation. The baud rate is 2742.86 symbols per second with 7 bits per baud. The constellation 36 has 160 complex 2-dimensional symbols, i.e., signal points, with each symbol having a specific alphanumerical identifier. The symbols are divided up into outer and inner points, with a circle around each signal point that is an outside point. The symbol constellation 36 also is divided into four subsets A0, A1, B0, B1, which are the first portion of the symbol identifier. After the subset identifier, separately for both inner or outer symbol groups, the symbols within each subset are designated in the symbol identifier by the number after the hyphen. For example, the symbol identifier "A0-5" for a circled point indicates an outer point from the subset A0, with that particular point being designated by number 5 within the outer points of the subset A0. In summary, the constellation is not only partitioned into four subsets of A0, A1, B0, and B1, but the constellation is also divided into a portion having inner points and a portion having outer points. Although the preferred embodiment has four subsets, different numbers and arrangements of subsets are possible. The units of the graph of FIGS. 2A and 2B are shown in volts.

Each subset is represented by a two bit number shown in Table 1.

TABLE 1

| Subset | Subset Index | |
|--------|-----|-----|
|        | MSB | LSB |
| A0     | 0   | 0   |
| B1     | 0   | 1   |
| B0     | 1   | 0   |
| A1     | 1   | 1   |

Thus, the subset-selecting bits 26 form an output of the (m, m−1) convolutional encoder 18 of FIG. 1 which can be represented by n 2-dimensional subsets of the form shown in Table 1. The integer m is equal to 2n plus the number of symbol selecting bits. MSB and LSB stand for most significant bit and least significant bit, respectively.

Figure 3:
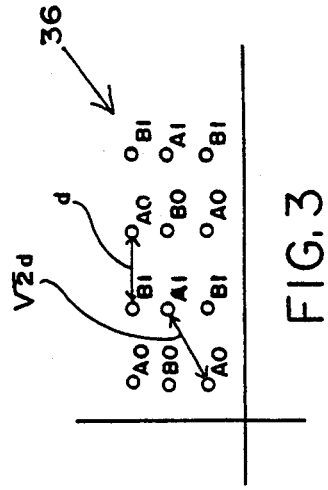
FIG. 3 shows a fragmented portion of the upper, right hand quadrant of the signal constellation and illustrates the distance properties in the constellation.

To better illustrate the subset to symbol mapping provided by the symbol generator 22, a portion of the first quadrant of the symbol constellation 36 shown in FIG. 2A is enlarged and shown in FIG. 3. The symbols of the constellation 36 are on a square grid of the complex plane. From FIG. 3 it can be seen that the maximum Euclidean distance of $2^{\frac{1}{2}}(d)$ occurs between A0 and A1 as well as between B0 and B1. The minimum distance of d is between A0 and B0, A0 and B1, A1 and B0 and A1 and B1. The maximum Hamming distance also occurs between A0 and A1, as well as between B0 and B1.

Figure 5:
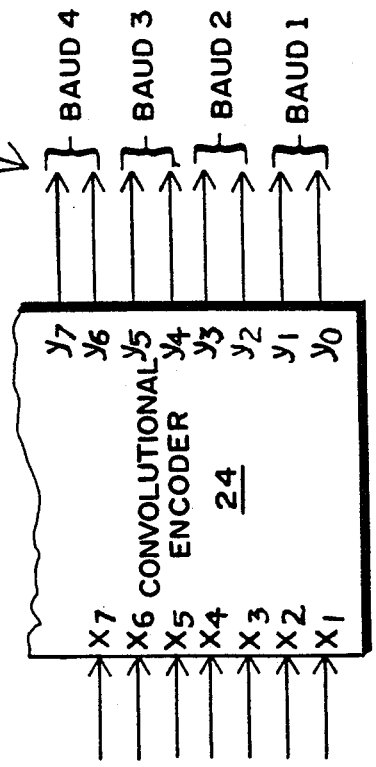
FIG. 5 is a schematic diagram of a portion of the convolutional encoder which generates the subset-selecting bits.

FIG. 4 shows a packet of data generated by the serial to parallel converter 16 of FIG. 1 which comprises 28 bits which go to the convolutional encoder 18. The bits $x_8$–$x_{28}$ are the symbol-selecting bits 20. As shown in FIG. 5, bits $x_1$, $x_2$, $x_3$, $x_4$, $x_5$, $x_6$, and $x_7$ form the input bits 24 to convolutional encoder 18. As shown in FIGS. 5 and 6, the output bits $y_7$, $y_6$, $y_5$, $y_4$, $y_3$, $y_2$, $y_1$, and $y_0$ of the encoder 18 are grouped into four bit groups ($y_7$ $y_6$), ($y_5$ $y_4$), ($y_3$ $y_2$) and ($y_1$ $y_0$) that defines a frame 48 of bits. As will be explained hereinafter, bits $x_1$–$x_7$ form only a portion of the expanded bit sequence output of the encoder 18. FIGS. 5 and 6 shows the assignment of bit groups for each baud in the frame 48, with each bit group 50 defining a bit pair in the preferred embodiment. Each frame 48 has the duration of a group interval (time interval) that is four bauds in duration. Via Table 1, each bit group 50 corresponds to one of the four 2-dimensional subsets A0, A1, B0 and B1. A symbol is transmitted from one of the 2-dimensional subsets in each of the four bauds. When viewed on a multidimensional level, each frame 48 of eight bit output of the encoder 18 correspnds to one of 256 8-dimensional symbol subsets, with each multidimensional symbol subset corresponding to a different combination of four 2-dimensional symbol subsets. For example, the multidimensional symbol subset A1 B0 A0 B0 (11100010) corresponds to 2-dimensional symbol subsets (11), (10), (00) and (10).

From this point on we will use superscripts to indicate the order of the bits inside the frame and subscripts to refer to the frame number in which the bits occurs. For example, referring to frame 48 in FIG. 6, bit $x_7$ occurring in the nth frame will be referred to as $x_n^7$. Table 2 shows the assignment of points from inner and outer points of the constellation 36 shown in FIGS. 2A-2B for different values of $x_n^8$, $x_n^9$ and $x_n^{10}$. Bit $x_n^8$ indicates whether the frame 48 has any outer points or not. If the frame 48 (i.e., one of the bauds of the frame)

were to have an outer point, then the dibit $x_n^9$ $x_n^{10}$ would indicate in which baud (and therefore bit group) the outer point would occur. In Table 2, "Inner" means inner point and "Outer" means outer point.

TABLE 2

| $x_n^8$ | $x_n^9$ | $x_n^{10}$ | baud 1 | baud 2 | baud 3 | baud 4 |
|---|---|---|---|---|---|---|
| 0 | X | X | Inner | Inner | Inner | Inner |
| 1 | 0 | 0 | Outer | Inner | Inner | Inner |
| 1 | 0 | 1 | Inner | Outer | Inner | Inner |
| 1 | 1 | 0 | Inner | Inner | Outer | Inner |
| 1 | 1 | 1 | Inner | Inner | Inner | Outer |

Table 3 shows how the symbol-selecting bits 20 of FIGS. 1 and 4 are assigned with each group of $x_n^8$, $x_n^9$, and $x_n^{10}$.

TABLE 3

| $x_n^8$ | $x_n^9$ | $x_n^{10}$ | baud 1 | baud 2 | baud 3 | baud 4 |
|---|---|---|---|---|---|---|
| 0 | X | X | $x_n^9 - x_n^{13}$ | $x_n^{14} - x_n^{18}$ | $x_n^{19} - x_n^{23}$ | $x_n^{24} - x_n^{28}$ |
| 1 | 0 | 0 | $x_n^{11} - x_n^{13}$ | $x_n^{14} - x_n^{18}$ | $x_n^{19} - x_n^{23}$ | $x_n^{24} - x_n^{28}$ |
| 1 | 0 | 1 | $x_n^{11} - x_n^{15}$ | $x_n^{16} - x_n^{18}$ | $x_n^{19} - x_n^{23}$ | $x_n^{24} - x_n^{28}$ |
| 1 | 1 | 0 | $x_n^{11} - x_n^{15}$ | $x_n^{16} - x_n^{20}$ | $x_n^{21} - x_n^{23}$ | $x_n^{24} - x_n^{28}$ |
| 1 | 1 | 1 | $x_n^{11} - x_n^{15}$ | $x_n^{16} - x_n^{20}$ | $x_n^{21} - x_n^{25}$ | $x_n^{26} - x_n^{28}$ |

FIG. 7 shows the convolutional encoder 18 of FIGS. 1 and 5 in detail. The encoder 18 is a 64 state (8, 7) encoder. As previously described, the input bits to the encoder are $x_n^i$, where i=1 through 28 and the output bits are $y_n^i$, where i=0 through 28. As is well-known, the encoder adds one redundancy bit; however, in the preferred embodiment the encoder adds less than one bit per baud of redundancy into the system. Encoders with redundancies greater than one bit (and therefore redundancy of one or greater per baud) can be used with the present invention. Input bits $x_n^8$ through $x_n^{28}$ are passed through unchanged and unused to become output bits $y_n^8$ through $y_n^{28}$. Inputs $x_n^4$-$x_n^7$ are used but pass through the encoder 18 without being changed and become output bits $y_n^4$-$y_n^7$. The input bits $x_n^1$-$x_n^3$ are expanded to create the output bits $y_n^0$-$y_n^3$. The output bits of $y_n^0$ through $y_n^{28}$ are identified as the expanded bit sequence, which includes the subset-selecting bits $y_n^0$-$y_n^7$ and the symbol-selecting bits $y_n^8$-$y_n^{28}$. The convolutional encoder 18 includes four modulo 2 adders 52, 54, 56, and 58, each connected to receive at least some of the bits $x_n^3$, $x_n^2$, and $x_n^1$. The encoder 18 includes six delay elements 60, 62, 64, 66, 68, and 70, with each element providing a delay of one group interval (four bauds).

With reference to FIG. 7, the input-output relationships of the subset-selecting bits 26 of the encoder 18 are as follows:

$y_n^7 = x_n^7$ (Equation 1)

$y_n^6 = x_n^6$ $y_n^5 = x_n^5$ $y_n^4 = x_n^4$ $y_n^3 = x_n^3(1 \oplus D) \oplus x_n^2(D \oplus D^2) \oplus x_n^1 D \oplus x_n^7 \oplus x_n^6 \oplus x_n^5$ $y_n^2 = x_n^3 D^2 \oplus x_n^2 \oplus x_n^1(D \oplus D^2) \oplus x_n^7 \oplus x_n^6 \oplus x_n^4$ $y_n^1 = x_n^2 D^2 \oplus x_n^1(1 \oplus D \oplus D^2) \oplus x_n^7 \oplus x_n^5 \oplus x_n^4$ $y_n^0 = x_n^3(1 \oplus D \oplus D^2) \oplus x_n^2(1 \oplus D) \oplus x_n^1 \oplus x_n^6 \oplus x_n^5 \oplus x_n^4$ where D is a delay element and $\oplus$ means an exclusive OR operation.

Figure 8:
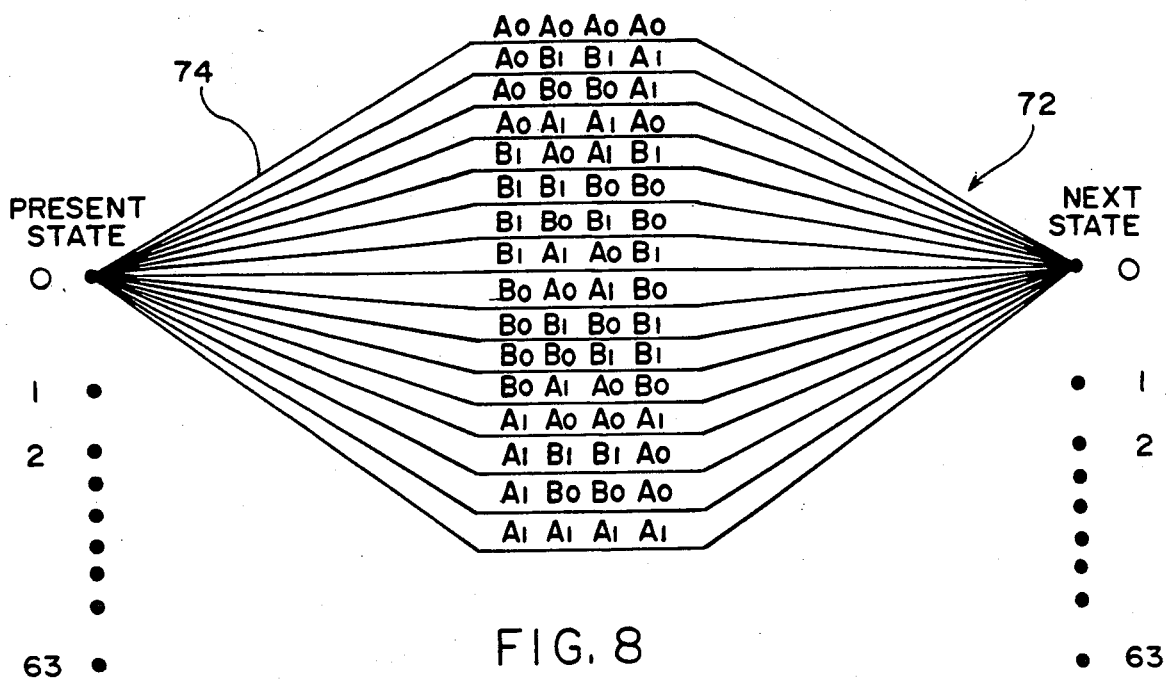
FIG. 8 shows two states of the trellis with the branches shown between the present state zero and the next state zero.

The convolutional encoder 18 is a finite state device which passes through a succession of states, with each state being separated in time by one group interval. Referring to the trellis diagrams in FIG. 8, the encoder 18 has 64 possible states (not all shown). Due to the fact that the encoder 18 has three binary inputs, for a given present state, only 8 of the next states are permissible. Which next state occurs is a function of the present state and on the combination of the $x_n^1$, $x_n^2$, and $x_n^3$ bits received each group interval. Each transition from one state to another state is identified as a branch. In general, the trellis can be used to diagram all permissible transitions between the present state to the next state of the encoder, although only the branches 74 between present state 0 and next state 0 are shown in FIG. 8. There are 256 possible branches which exist in the trellis. These 256 branches are subdivided into two groups of 128 branches each. The branches from a present state to a next state can be either from one or the other group. Extending from the present state 0, 128 branches exist in the trellis 72, with 16 branches going to each of 8 permissible next states (only one set of 16 is shown). Likewise, 128 branches can extend from each present state in the same manner and this is extended continuously between adjacent states separated by group intervals. In the preferred embodiment, the group used of the two groups of 128 branches alternates with the states, e.g., state 0 using one group and state 1 using the other group and so on.

From FIG. 7 and the Equations 1 for encoder 18, it can be shown that $x_n^7$, $x_n^6$, $x_n^5$ and $x_n^4$ do not affect the states. In other words, changing any one or all of these bits does not change the state. Hence, between any two given states occurring at successive group intervals, there will be the previously described sixteen parallel branches, with each of the sixteen branches having a different multidimensional symbol subset associated with it, as shown in FIG. 8. This set of sixteen parallel branches will be referred to as a coset. The 256 branches can be decomposed into 16 cosets. Hence, between a present state and each of 8 next permissible states, there will be 16 branches with each branch being labeled by one of the 16 multidimensional symbol subsets of a given coset. With respect to FIG. 8, in the preferred embodiment, 8 of the cosets are assigned to even number states and 8 are assigned to odd number states. For the purpose of illustration, only the multidimensional symbol subsets of the coset associated with the branches going from present state 0 to next state 0 are shown in FIG. 8. The multidimensional symbol subsets associated with each branch can be indexed by integers ranging from 0 to 255. The index can be expressed as:

Index of 8 dimensional subset=64(index of subset for baud 4) +16(index of subset for baud 3)+4(index of subset for baud 2)+index of subset for baud 1.

As to the multidimensional symbol subsets associated with each branch, the 2-dimensional subsets therein preferably, but not necessarily, are arranged as a frame of subsets for bauds 4, 3, 2, 1, in that order. The encoder 18 transmits 29 bits in 4 bauds or 7.25 bits per baud.

Figure 9:
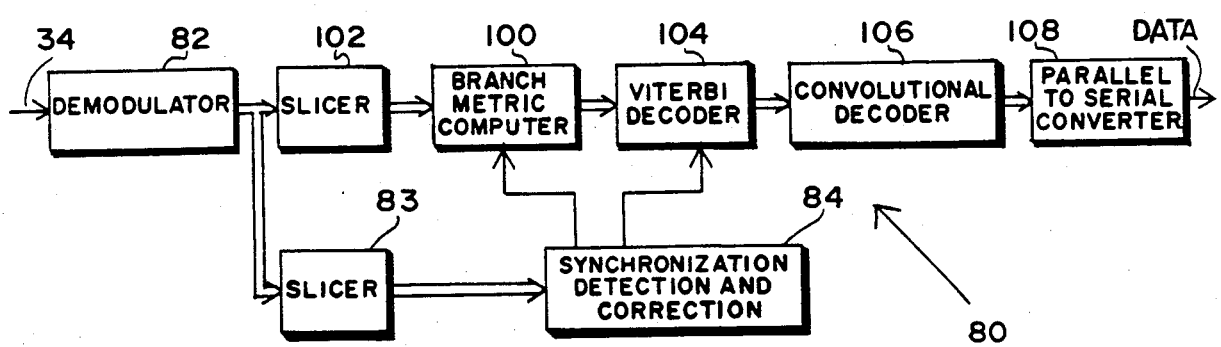
FIG. 9 is a block diagram of the receiver of the first embodiment of the present invention.

A receiver 80 of the modem 10 is generally shown in the block diagram of FIG. 9 and includes a demodulator 82. The noise affected modulated carrier signal is received over the channel 34 and in a conventional manner that will not be detailed herein is passed through the demodulator 82 where the signal is filtered, equalized and demodulated in a conventional manner to produce a baseband signal consisting of a stream of received 2-dimensional symbol signals. As described hereinafter in detail, the rest of the circuitry processes the stream of received 2-dimensional symbol signals and decides which of the multidimensional symbols were sent by means of the maximum likelihood sequence estimation technique using the Viterbi algorithm. The maximum likelihood path is determined by which permissible multidimensional symbol sequence is closest in Euclidean distance squared (as will be described hereinafter) to that of received multidimensional symbol sequence.

This decoding process is repeated for each frame of received subset-defining bits (e.g., bits defining a multidimensional symbol subset), which is the received version of the frame transmitted and shown in FIG. 6. To accomplish this, in the receiver 80, the receiver operation is syncrhonized to the received frames of the incoming signal i.e., the receiver must know the beginning of each frame. In other words, the receiver must determine which bit group in the received frame of subset-defining bits corressponds to the bit group ($y_1$ $y_0$) in the transmitted subset-defining bits. Having found this starting bit group, the received frame of received subset-defining bits is synchronized with the consecutive frames of subset-defining bits transmitted.

As shown in FIG. 9, the first step in assuring proper synchronization is to perform a conventional slicing operation at slicer 83 on the baseband signal from the demodulator 82. Since the baseband signal comprises a sequence of digitized 2-dimensional symbols, the slicer in a normal manner merely determines the closest ideal symbol in Euclidean distance from the symbol constellation 36 shown in FIGS. 2A-2B. Once the ideal symbol is determined, its 2-dimensional subset is known. Consequently, a string of received subset-defining bits representing the 2-dimensional subsets are fed to synchronization detection and correction means 84, such sequences, with proper synchronization, being identical to the subset-defining bits from encoder 18 in the absence of errors introduced by the transmission medium.

In the detection and correction means 84, a parity check equation is applied to four successive groups of four bauds of bits, so as to define a moving window forming four candidate frames in a manner to be described hereafter. As is shown, using polynomial notation, the receiver's binary sequence within a given received frame must satisfy the generalized party check equation as follows:

$$P_n = [\hat{y}_n^r \ldots \hat{y}_n^1, \hat{y}_n^0] \times [H^r(D) \ldots H^1(D), H^0(D)]^T = 0 \quad \text{(Equation 2)}$$

where H(D) is the parity check matrix which is shown as a function of a delay operator D, where the y's are the subset-defining bits of a group interval n, and where T means transpose. As to notation, the received bit sequence is differentiated from the transmitted bit sequence by the use of a hat on top of the variable, e.g., (y and $\hat{y}$). It will be seen hereinafter that the use of Equation 1 has been used in the present invention to define a function $P(j)_n$, where $1 \leq j \leq 4$.

Applying Equation 2 to the specific convolutional encoder 18 shown in FIG. 7, we obtain:

$$P_n = [\hat{y}_n^7 \, \hat{y}_n^6 \, \hat{y}_n^5 \, \hat{y}_n^4 \, \hat{y}_n^3 \, \hat{y}_n^2 \, \hat{y}_n^1 \, \hat{y}_n^0] \begin{bmatrix} 1 \oplus D \oplus D^2 \oplus D^6 \\ 1 \oplus D^4 \oplus D^2 \oplus D^6 \\ 1 \oplus D \oplus D^2 \oplus D^3 \oplus D^4 \oplus D^6 \\ 1 \oplus D \oplus D^2 \oplus D^5 \oplus D^6 \\ 1 \oplus D^3 \oplus D^5 \oplus D^6 \\ 1 \oplus D^4 \oplus D^6 \\ 1 \oplus D \oplus D^2 \oplus D^3 \oplus D^4 \oplus D^5 \oplus D^6 \\ 1 \oplus D^3 \oplus D^6 \end{bmatrix} \quad \text{(Equation 3)}$$

This equation becomes:

$$P_n = \hat{y}_{n-6}^7 \oplus \hat{y}_{n-2}^7 \oplus \hat{y}_{n-1}^7 \oplus \hat{y}_n^7 \oplus \hat{y}_{n-6}^6 \oplus \hat{y}_{n-5}^6$$
$$\oplus \hat{y}_{n-4}^6 \oplus \hat{y}_n^6 \oplus \hat{y}_{n-6}^5 \oplus \hat{y}_{n-4}^5 \oplus \hat{y}_{n-3}^5 \oplus \hat{y}_{n-2}^5 \oplus \hat{y}_{n-1}^5 \oplus \hat{y}_n^5 \oplus$$
$$\hat{y}_{n-6}^4 \oplus \hat{y}_{n-5}^4 \oplus \hat{y}_{n-2}^4 \oplus \hat{y}_{n-1}^4 \oplus \hat{y}_n^4 \oplus \hat{y}_{n-6}^3 \oplus \hat{y}_{n-5}^3 \oplus \hat{y}_{n-3}^3 \oplus$$
$$\hat{y}_n^3 \oplus \hat{y}_{n-6}^2 \oplus \hat{y}_{n-4}^2 \oplus \hat{y}_n^2 \oplus \hat{y}_{n-6}^1 \oplus \hat{y}_{n-5}^1 \oplus \hat{y}_{n-4}^2 \oplus \hat{y}_{n-3}^2 \oplus$$
$$\hat{y}_{n-2}^2 \oplus \hat{y}_{n-1}^2 \oplus \hat{y}_n^1 \oplus \hat{y}_{n-6}^0 \oplus \hat{y}_{n-3}^0 \oplus \hat{y}_n^0 \quad \text{(Equation 4)}$$

where $\oplus$ means Exclusive OR function.

There are two $\hat{y}$ bits defining each of the bit groups of subset-selecting bits. As can be seen from Equation 4, a single calculation of Equation 4 requires $\hat{y}$ bits from seven group intervals (frames), i.e., $y_n$ to $y_{n-6}$.

Since Equation 4 is the parity check equation P, when bits from a succession of seven located frames (assuming no errors in received signal) are plugged into Equation 4, it is equal to zero. In the present invention, the parity check equation P is used to verify synchronization. When this series of seven frames is offset by one, two, or three bauds, the output of the parity check equation P is non-zero, such output being incapable of being used to distinguish between the three possible offsets of the sets of frames, all of which can occur with loss of frame synchronization.

According to the invention, offsets of 0, 1, 2 and 3 bit groups (symbol intervals) are introduced into the received signal so as to generate four sets of seven frames and the parity check equation is calculated for each set. Instead of looking at the results of one set of four calculations of Equation 4, these calculations are repeated with the receipt of additional frames, and the results for each offset is accumulated. After accumulating the results over a number of group intervals, the offset (0, 1, 2 or 3 bit groups) with the lowest accumulative value determines the proper framing for the frames of bit groups. Looking at the accumulative values prevents wrong decisions from being made due to errors in the received signal. The specific steps of this procedure is described hereinafter.

In FIGS. 10A through 10D, for the purposes of simplicity, each pair of bits, i.e., bit group of subset selecting bits, derived from one of the received detected 2-dimensional symbols, is represented by the letter "R" with the subscript designating the baud period, e.g., $(\hat{y}_n^{i+1}, \hat{y}_n^i) = Ra$, where i represents the individual bits in the frame. To find the beginning of the frame, the invention uses the following procedure.

Figure 10A:
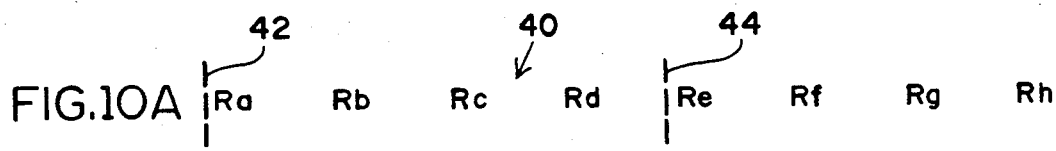
FIG. 10 A through D show the bit groups as provided to the means for detecting and maintaining synchronization and the moving window superimposed there over.

Referring to FIGS. 10A through 10D, a moving window 40 is defined by a pair of dashed lines 42 and 44 and is of the same bit length as the received frame. Each four bit pairs R, i.e., bit groups, contained within the window 40 define one candidate frame from a set of four candidate frames associated with a time period, which in this embodiment is the current group interval. The first candidate frame of FIG. 10A is the received frame, with the remaining candidate frames of the set being offset by multiples of a symbol interval and an integer b (where $1 \leq b \leq 3$). Relative to a given group interval, the last bit group of the received frame becomes the first bit group of the last candidate frame of the set. Since the parity check Equation 4 requires a series of seven frames over seven group intervals, each position of the moving window 40 defines the bits to be in one of four series of seven consecutive frames, all of the frames in a series having the same symbol interval offset. The frame 40 is shown in FIGS. 10A through 10D only for the current candidate frame (for the most current group interval) of each series of seven frames. However, each current candidate frame is part of one series which also includes six previous candidate frames having the same offset of symbol intervals relative to the beginning of successive, previous group intervals. In other words, although only one frame 40 is shown in each of the FIGS. 10A through 10D, if the bit groups were shown extending back far enough, then there would be seven windows 40 in a row for each of the FIGS. 10A through 10D, representing the bits used in a single parity check equation calculation.

Figure 11:
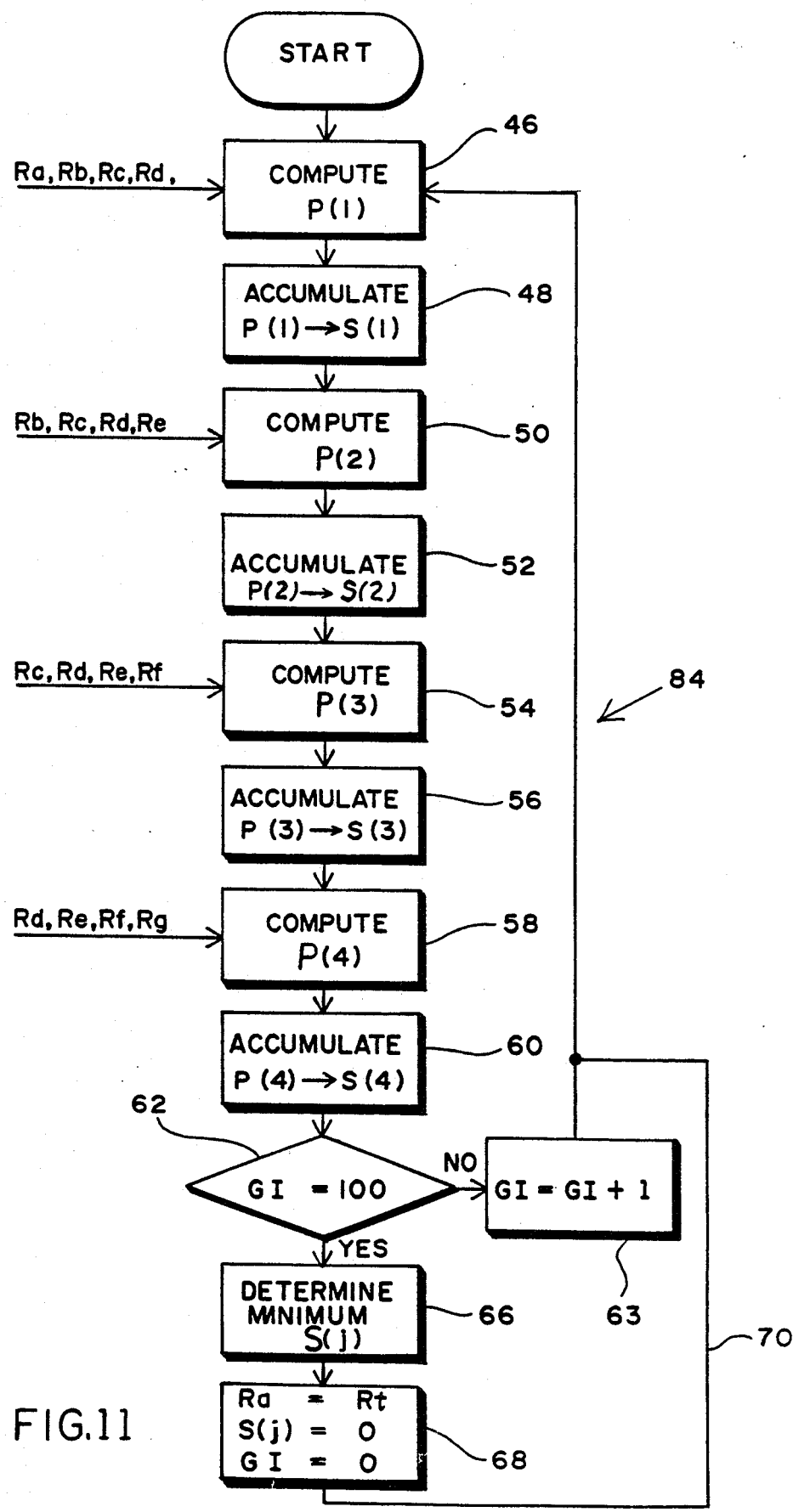
FIG. 11 shows the flow diagram of the synchronization detection and maintaining means of the first embodiment of the present invention.

First, as shown in FIGS. 10A and 11, the bit pair Ra is assumed to be the first bit group in the received frame. As shown in FIG. 11, the parity check Equation 4 is calculated at block 46 using Ra through Rd and its results are designated as P(1). A cumulative count of P(1) is done at block 48 as follows:

$$\Sigma P(1) = S(1)$$

Figure 10B:

Second, as shown in FIGS. 10B and 11, Rb is assumed to be the beginning of the frame, and the parity check Equation 4 is applied at block 50 to bit groups sequence of Rb through Re to define P(2). A cumulative count at block 52 is kept as follows:

$$\Sigma P(2) = S(2)$$

Figure 10C:
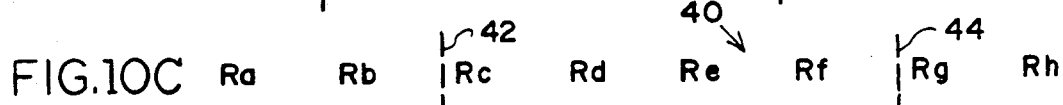

Third, as shown in FIGS. 10C and 11, Rc is assumed to be the beginning of the frame, and the parity check Equation 4 is applied at block 54 to bit groups sequence of Rc through Rf to define P(3). A cumulative count at block 60 is kept as follows:

$$\Sigma P(3) = S(3)$$

Figure 10D:
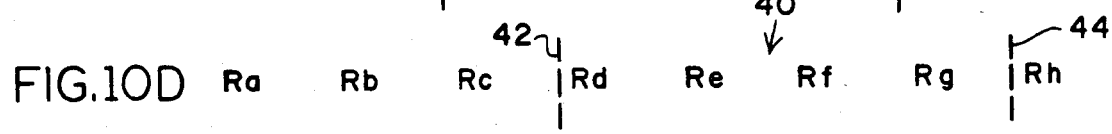

Fourth, as shown in FIGS. 10D and 11, Rd is assumed to be the beginning of the frame, and the parity check Equation 4 is applied at block 58 to bit groups sequence of Rd through Rg to define P(4). A cumulative count at block 60 is kept as follows:

$$\Sigma P(4) = S(4)$$

Referring to FIG. 11, the above four steps incorporated in blocks 46 through 60 are repeated typically, but not necessarily, for every one of 100 group intervals GI. As shown in block 62, during the 100 group intervals, the counter therein will cause the program to continue to increase the GI value at block 63 and to branch through loop 64, with the results from the parity check calculations P(j) continuing to add to the values of S(j), where $1 \leq j \leq 4$. After each 100 group intervals, the minimum S(j), is determined at block 66 and identified as Rt (where Rt can be Ra, Rb, Rc or Rd). Rt now becomes the new Ra at block 68, which will be the beginning of a new series of calculations, with S(j) and GI being set to zero at block 68. The decoder 86 then operates on the assumption that the new Ra is the beginning of the frame and will not deviate therefrom until further calculations indicates a new Ra. More specifically, via line 70, the program returns to the new series of calculations in the loop 64, which includes blocks 46 through 63. Until the receiver synchronization is achieved, no customer data is allowed. Each frame of the window 40 is offset or displaced from another frame by one bit group. Hence, for a frame sent by the transmitter with four bit groups, the receiver must consider four different frames, i.e., for each group interval the number of frames considered by the receiver is equal to the number of bit groups and bauds in a frame (window 40). If desired, the cumulative values can be replaced by average values, i.e., cumulative value divided by the number of group intervals occurring during the accumulation.

If the selected series of candidate frames differs from the received frames, then the received bit groups will have framing according to that of the selected series. The registers for the synchronization correction are described with respect to the second embodiment to be described hereinafter.

A branch metric is the distance between a received multidimensional signal and possible multidimensional symbol from the multidimensional symbol subset corresponding to the branch of the trellis. A Viterbi decoder (to be described hereinafter) computes a cumulative path metric for each of the survivor paths during each frame. This cumulative path metric is the arithmetic sum of the metrics of the individual branches which form the particular path. Hence, it is necessary to first obtain the branch metric for each of the previously described 256 branches. As mentioned earlier, the indices of the ideal multidimensional symbols are in one to one correspondence with the sequence of baud based 2-dimensional symbol sets. Hence, in order to find the distance between a received branch and an ideal branch with a certain index value, it is necessary to know when the receiver frame starts. As shown in FIG. 9, for this purpose synchronization is provided from means 84 to a branch metric computer 100.

Referring to FIG. 9, the operation of slicer 102 will be described. As will be obvious to one skilled in the art, the slicer 102 operation can be merged into and be part of the slicer 83 operation. Each received multidimensional signal provides information in the form of the multidimensional subsets of the multidimensional points sent. As previously mentioned, the received 8-dimensional signal can be decomposed into four 2-dimensional signals which occur consecutively. More specifically, each frame of the received multidimensional signal can be represented as R(1), R(2), R(3), and R(4), where:

$$R(J)=[RX(J), RY(J)], 1<J<4 \quad \text{(Equation 5)}$$

A symbol (ideal point) in the signal constellation can be represented as:

$$IDL(K, L, N)=[IDLX(K, L, N), IDLY(K, L, N)] \quad \text{(Equation 6)}$$

where
- K=0 means that the point is inner
- K=1 means that the point is outer
- L=1 means that the point belongs to subset A0
- L=2 means that the point belongs to subset B1
- L=3 means that the point belongs to subset B0
- L=4 means that the point belongs to subset A1
- and N=index of the point in the subset.

In the preferred embodiment, N can take on values from 0 to 31, if the point belongs to the inner part of the constellation (that part comprised of inner points) and N=0 to 7 for points on the outer part of the constellation (that part comprised of outer points). For each K, L and J, the slicer 102 finds the N=$N_{min}$, such that $$|R(J) - IDL(K, L, N_{min})| < |R(J) - IDL(K, L, N)| \quad \text{(Equation 7)}$$

where $|R(J) - IDL(K, L, N)|^2 =$ $$|RX(J) - IDLX(K, L, N)|^2 + |RY(J) - IDLY(K, L, N)|^2$$

The slicer 102 thus finds eight nearest points for the received signal of each baud such that four are inner points and four are outer points. A pair of inner and outer points belong to each of the four subset A0, B0, B1 and A1. For each baud of the four baud frames, we can denote the distance (metric) between each of the ideal point and the received points as d[J, K(J), L(J), $N_{min}$(J)]. Thus $$|R(J)-IDL(K, L, N_{min})|<|R(J)-IDL(K, L, N)| \quad \text{(Equation 8)}$$

As previously explained, each branch of the trellis corresponds to a possible multidimensional symbol subset (therefore a four baud signal in the frame) and in this embodiment there are 256 branches, i.e., A0 A0 A0 A0 through A1 A1 A1 A1. For each branch we can construct five possible signal combinations of 2-dimensional subsets having inner (In) and outer (Out) points as shown in Table 4.

TABLE 4

| In  | In  | In  | In  |
|-----|-----|-----|-----|
| Out | In  | In  | In  |
| In  | Out | In  | In  |
| In  | In  | Out | In  |
| In  | In  | In  | Out |

In Table 4 we assume that the left most signal of the frame belongs to the first baud and the right most signal is that of the fourth baud.

As previously discussed, subset-selecting bits $x_8$, $x_9$, $x_{10}$ specify which 2-dimensional subset of said multidimensional subset in a given frame during a given group interval will have an outer point. There is only one 2-dimensional subset (represented by the bit group) that will have an outer point, with the remainder of the subsets having inner points. Hence, this creates only the five previously described permissible combinations.

The branch metric computer 100 computes the branch metric term, which can be either equal to or proportional to $d_{BRANCH}(I)$ where $d_{BRANCH}(I)$ is defined by:

$$d_{BRANCH}(I)=[d^2(1, K(1), L(1), N_{min(1)})+d^2(2, K(2), L(2), N_{min(2)})+d^2(3, K(3), L(3), N_{min(3)})+d^2(4, K(4), L(4), N_{min(4)})] \quad \text{(Equation 9)}$$

This computation is done for each of the five combinations shown in Table 4 and the combination with the least value is chosen as the metric for the branch. The index I identifies the branch and extends from 0 to 255, showing that this calculation is repeated for each branch. Consequently, at this point we have 256 $d^2$ values, one for each of the 256 branches, with each squared distance $d^2$ value representing the squared distances between the received 2-dimensional signal and the contending 2-dimensional symbol subsets.

Next, the branch metric computer 100 selects for each coset (group of 16 branches each) that branch which has the minimum branch metric, which results in reducing the number of contending branches (multidimensional symbol subsets) from 256 to 16. Only one branch of each coset can form a part of the maximum likelihood path. Thus, the described reduction by a factor of 16 of the contending branches is based upon which branch of said coset represents the multidimensional symbol subset which is closest to the received multidimensional signal.

Generally, the Viterbi decoder 104 in the receiver 80 uses the received multidimensional signals to estimate the original path of the encoder 18 through the trellis, such trellis being discussed with respect to FIG. 8. The maximum likelihood path is determined by finding the possible sequence of multidimensional symbol subsets (which trellis path) which is closest to the sequence of received multidimensional signals. During every frame, the receiver computes the minimum cost path and from the path history, determines the estimated multidimensional symbol. As shown in FIG. 9, means 84 provides synchronization for the Viterbi decoder 104.

As is well-known, the Viterbi decoder 104, during each frame (group interval) extends each of the surviving paths to their successor state at the next frame. The metric of the extended path is obtained by adding the metric of the survivor to the branch metric of the corresponding branch which extends the path. The survivor at the next frame at a given state is found by comparing the metrics of all the extended paths which connect to a given state and choosing the minimum. More specifically, extending the path history can be mathematically characterized by computing:

$$c(i, n)=_j\text{Minimum }\{c(j, n-1)+r(i, j)\} \quad \text{(Equation 10)}$$

where $c(j, n-1)$ is the surviving metric of the jth state at time $t=(n-1)T_{frame}$, $r_{(i, j)}$ is the branch metric of the output branch which connects the jth state at time $t=(n-1)T_f$ to the ith state at $t=nT_f$. $c(i, n)$, the cost at the ith state at time $t=nT_f$, is obtained by minimizing over all j which are connected to state i. Thus, the path history of the surviving paths is extended. Once the path history is extended the decoder 104 finds the minimum cost path among the survivors, and from the path history outputs the best estimate of the multidimensional symbol subset for the group interval to a conventional decoder 106. The delay between the present frame and the present estimate (of the past symbol) can be 3v frames, where v is the constraint length of the convolutional encoder 18 and in this case is 6.

From the retained knowledge of the received multidimensional sequence and from the knowledge of the closest multidimensional symbol subset of the maximum likelihood path, the best estimate of the transmitted multidimensional symbol (point) is obtained. From the estimated, transmitted multidimensional signal the convolutional decoder 106 produces the packet data. Finally a serial to parallel converter 108 converts this packet to serial data.

The modem in which the present invention is implemented is a microprocessor based modem. As will be appreciated by those in the art, the microprocessor-based modem control and data processing circuits also typically include the usual data storage elements (e.g., ROM for program control storage and the like, and RAM for variable input/output/intermediate result data, etc.) conventionally associated with a microprocessor CPU for performing desired manipulation of digital signals in accordance with a stored program. In the presently preferred exemplary embodiment, these already present microprocessor CPU, ROM and RAM elements are also utilized to perform the functions of the present invention. With the present invention, the modem functions are implemented in Texas Instrument's TMS 32020 processors. With respect to FIG. 1, all of the transmitter modem functions therein are preferable, but not necessarily, performed by the digital signal processor. As is well-known, after filtering in block 30, a D/A converter and antialasing filters are used. With respect to FIG. 9, all of the receiver modem functions of FIG. 9 are preferably, but not necessarily, performed by the digital signal processor. As is well-known, prior to demodulation, the received signal is processed by an A/D converter and filters.

Figure 12:
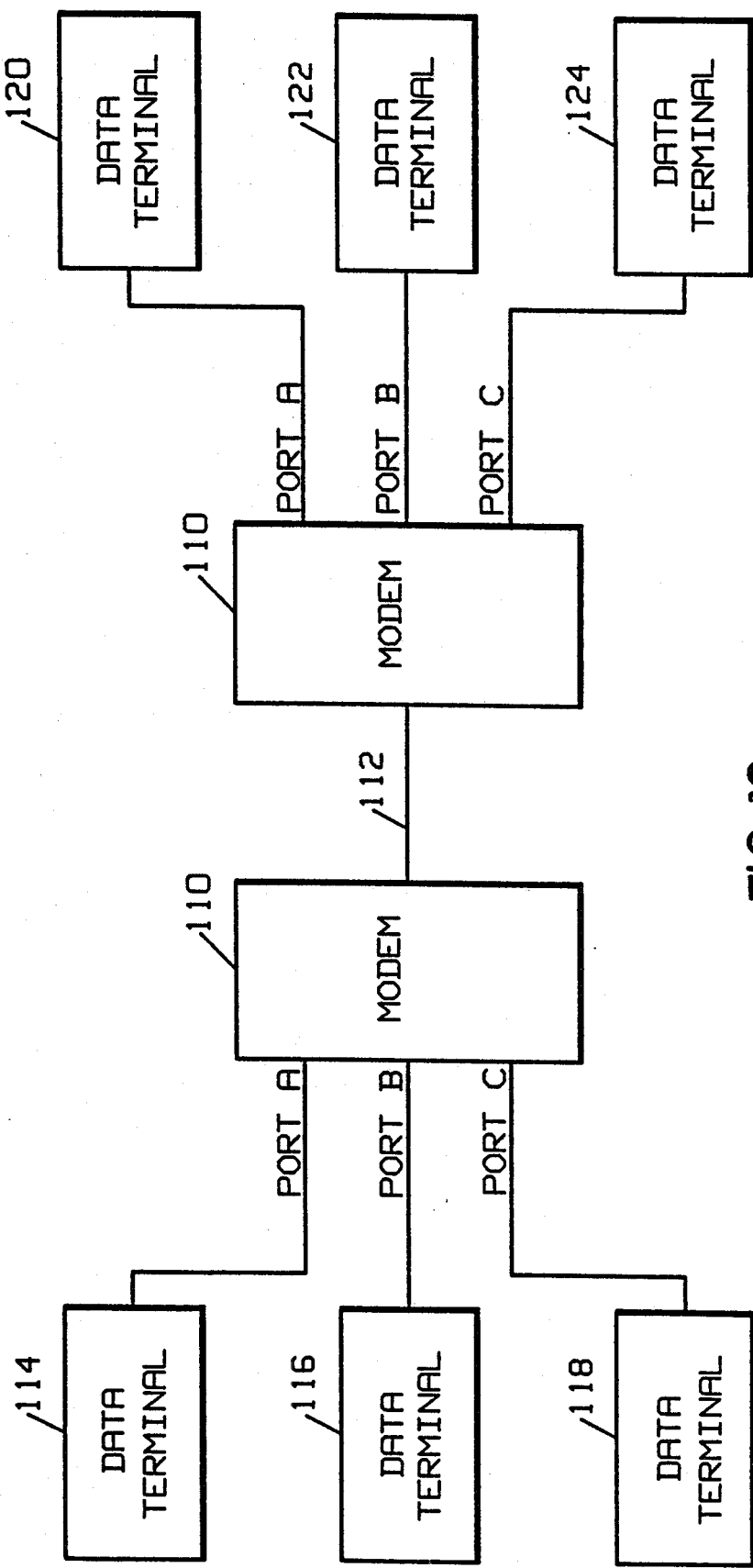
FIG. 12 shows end-to-end multiport modems.

Hereinafter, a second embodiment of the present invention will be shown wherein synchronization is provided for a multiport modem. Referring to FIG. 12, a pair of multiport modems 110 are shown at opposed ends of a transmission line 112. Each modem 110 is shown with three ports A, B and C, although this number can vary depending upon user needs. The ports at one end are connected to data terminals 114, 116, and 118 or like data transmission equipment and at the other end to data terminals 120, 122 and 124 or like data transmission equipment. Each modem 110 incorporates a well-known time division multiplexer and data is transmitted between the terminals 114 and 120; 116 and 122; and 118 and 124, respectively, via ports A, B and C on both ends.

This second embodiment of the present invention can be used in any multiport modem arrangement wherein (1) multidimensional coded modulation (N>2) is used and (2) the port allocation is not identically repeated each group interval, i.e., each frame of bit groups. As a few illustrative examples, when the modems 110 comprise the previously described 19.2K (bits per second) b.p.s. modem, as previously mentioned, it has 28 bits per frame (four-bauds) and has a port allotment for its three ports as shown in Table A. The 28 bits for each frame are shown in brackets. As can be seen from the Table A, the pattern of port allocations does not identically repeat each frame. In the following Table A (and like Tables thereafter), the first row identifies the successive chain of ports to which bits are allocated and the second row gives the number of bits allocated to each port when it is that port's turn.

TABLE A

| 19.2K Modem | Port A 9.6K | | Port B 7.2K | Port C 2.4K | |
|---|---|---|---|---|---|
| Ports [ABC | ABC | ABC A] | [BC ABC | ABC | ABC] |
| Bits [431 | 431 | 431 4] | [31 431 | 431 | 431] |
| Frame 1 | | | Frame 2 | | |

From Table A, the period of repetition is seen to be two frames. This period is referred to as the master frame. Each of the two frames comprising one master frame will be referred to as sub-frames of subset-defining bits. For the purpose of this aspect of the invention, a master frame exists and is defined for other speeds as well. For example, a 16.8K b.p.s. modem has 49 bits in a master frame with 25 bits being in frame 1 and 24 bits being in frame 2. A two port configuration for the 16.8K b.p.s. modem with Port A=9.6K and Port B=7.2K is shown in Table B.

TABLE B

| 16.8K Modem | Port A 9.6K | | Port B 7.2K | |
|---|---|---|---|---|
| Ports [AB | AB | AB A] | [B AB | AB AB] |
| Bits [43 | 43 | 43 4] | [3 43 | 43 43] |
| Frame 1 | | | Frame 2 | |

A 14.4K b.p.s. modem with three ports has 42 bits in a master frame as shown in TABLE C.

TABLE C

| 14.4K Modem | Port A 7.2K | | Port B 4.8K | Port C 2.4K | |
|---|---|---|---|---|---|
| Ports [ABC | ABC | ABC A] | [BC ABC | ABC | ABC] |
| Bits [321 | 321 | 321 3] | [21 321 | 321 | 321] |
| Frame 1 | | | Frame 2 | | |

A 12.0K b.p.s. modem with just two ports A and B (dropping ports C in FIG. 12) has a 35 bit master frame portioned as shown in TABLE D.

TABLE D

| 12.0K Modem | Port A 9.6K | | Port B 2.4K | |
|---|---|---|---|---|
| Ports [AB | AB | AB A] | [B AB | AB AB] |
| Bits [31 | 31 | 31 3] | [1 31 | 31 31] |
| Frame 1 | | | Frame 2 | |

For synchronization with a multiport modem, according to the present invention, it is necessary to distinguish between the odd and even numbered sub-frames. This distinction between sub-frames provides each of the channels with a fixed time position to occupy within the master frame and prevents the problem of port misalignment when recovering from a signal drop-out.

A brief overview of the invention follows. For the above-described purpose, at least alternate sub-frames, either even or odd numbered sub-frames, are sent with the symbols rearranged or changed in some manner so as to cause the parity check equation 3, when applied to the sub-frames of bit groups, i.e., 2-dimensional symbol subsets, to have a non-zero output. If this type of rearrangement or change occurs in just one of the two sub-frames of the master frame, either the even sub-frame or the odd sub-frame, the parity check equation will have the desired non-zero output. Additionally, this type of change can be made if the even and odd frames are interchanged or like alterations. Likewise, although less desirable in that more manipulation of data is required, this type of change can be made in one of the sub-frames of the master frame while a different change of this type can be made in the other sub-frame of the master frame, thereby giving the same desired result. As will be discussed in detail hereinafter in the specific examples, once this alteration is introduced in the transmitter, it must be removed in the receiver; however, prior to its removal, it can be used for detecting whether there is proper synchronization between transmitted master frames and received master frames, and if there is not, enough information is obtainable to achieve correct synchronization. In general, a moving window is applied to the received master frames in a manner to generate a plurality of successive candidate master frames, each one in the succession being offset from the previous one by an additional symbol interval until the last symbol interval in the received frame (which is also one of the candidate frames) becomes the first symbol interval in the last-to-be-generated candidate frame. Only one of these candidate frames is synchronized with the transmitted master frame. The candidate master frames define two things. First, it defines the beginning of the bit groups to be used in each parity check equation calculation (to be described hereinafter) and second, it defines where the above-described alteration should be found among the bit groups, if in fact that particular candidate master frame is the one which is synchronized with the transmitted master frame. In other words, since the anticipated location of the introduced alteration to the bit groups is preset with respect to each candidate frame (in several ways to be described hereinafter), the candidate frame whose associated parity check calculations results in locating the modification in the received bit groups where it anticipates finding the modifications thereby determines where the master frames should start in the received data.

Figure 13:
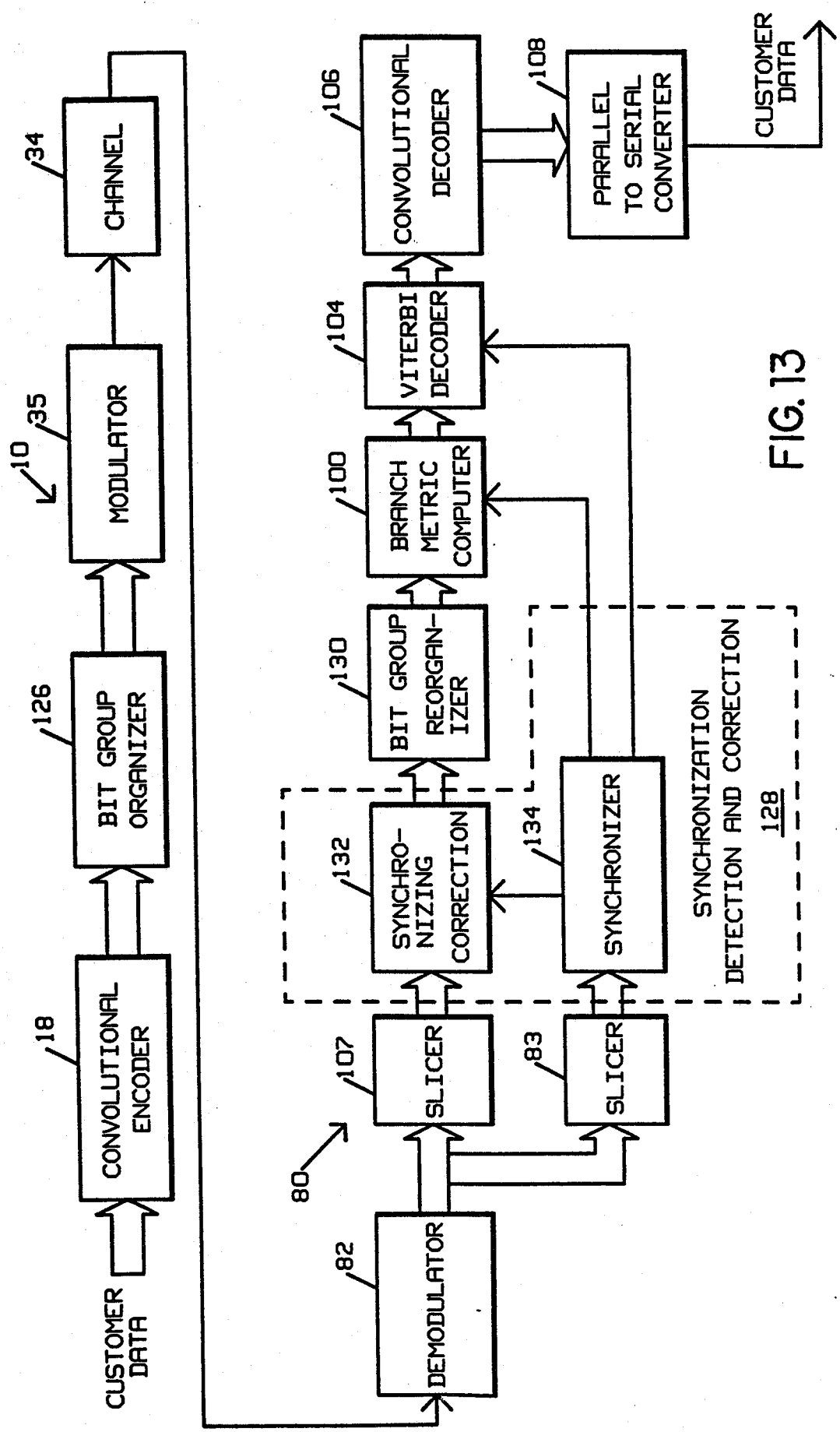
FIG. 13 shows a block diagram of the second embodiment of the present invention implemented in multiport modems.

Hereinafter, the multiport synchronization of the present invention will be described for the 19.2K modem which has been described in detail heretofor, but now with the multiport capacity as shown in FIG. 12, such capacity being well-known. Referring to FIG. 13, the overall system of the second embodiment of the present invention is shown. Most of the components are the same as the first embodiment shown in FIGS. 1 and 9, with the exception of the addition of the necessary components to provide the multiport synchronization; hence, the same components will be identified by the same reference numbers, and will not be described again hereinafter. In a bit group organizer 126 the bauds for frames are rearranged in the transmitter 10.

As one illustrative possibility of an introduced modification to the bit groups that are an output of the encoder 18, even numbered sub-frames will be rearranged, and more particularly, with even numbered sub-frames the order of the bauds, i.e., symbol intervals, are reversed as shown in TABLE E. The odd number frames are unchanged.

TABLE E

| Frame 1 | Frame 2 | Frame 3 | Frame 4 |
| --- | --- | --- | --- |
| 1234 | 4321 | 1234 | 4321 |

However, as will be obvious to one skilled in the art, reversing the bauds in the transmitter as shown in Table E is just one of 24 ways of reorganizing a four baud sub-frame, most of which can be used to practice the subject invention. In addition, as previously mentioned, reorganization of bit groups are just one subset of possible alternative resulting in the required change in the parity check Equation 2. Recalling the previous parity check Equation 2:

$$P=[\hat{y}_n^7 \ldots \hat{y}_n^1 y_n 0][H^7(D)H^6(D) \ldots H^1(D)H^0(D)]^T=0 \quad \text{(Equation 11)}$$

In general, in order to differentiate between even and odd sub-frames, any characteristics of the signal can be modified in every alternate frame as long as the alteration is such that $$P1=[\underline{F}_n][H^7(D)H^6(D)H^5H^4(D)H^3(D)H^2(D)H^1(D)\cdot H^0(D)]^T \neq 0 \quad \text{(Equation 12)}$$

where $\underline{F}_n$ is the bits of the altered bit groups as follows:

$$\underline{F}_n=(z_n^7 z_n^6 z_n^5 z_n^4 z_n^3 z_n^2 z_n^1 z_n^0)$$

As an example other than the previously described reorganization of the bit groups:

Assume $H^7(D)=D^6 \oplus D^4 \oplus D^3$ $H^6(D)=D^6 \oplus D^5 \oplus D^2 \oplus D$ In this case, it is assumed that only the fourth symbol is rotated by 180 degrees, in which case:

$z_n^7 = y_n^{-7}, \; z_n^6 = y_n^{-6}, \; z_n^5 = y_n^5, \; z_n^4 = y_n^4, \; z_n^3 = y_n^3,$ $z_n^2 = y_n^2, \; y\,z_n^1 = y_n^1, \; z_n^0 = y_n^0,$ $P1 = y_n^{-7}H^7(D) \oplus y_n^{-6}H^6(D) \oplus y_n^5H^5(D) \oplus y_n^4H^4(D) \oplus$ $\qquad y_n^3H^3(D) \oplus y_n^2H^2(D) \oplus y_n^1H^1(D) \oplus y_n^0H^0(D)$ $P = y_n^7H^7(D) \oplus y_n^6H^6(D) \oplus y_n^5H^5(D) \oplus y_n^4H^4(D) \oplus$ $\qquad y_n^3H^3(D) \oplus y_n^2H^2(D) \oplus y_n^1H^1(D) \oplus y_n^0H^0(D)$ $P1 \oplus P = y_n^{-7}H^7 \oplus y_n^{-6}H^6 \oplus y_n^7H^7 \oplus y_n^6H^6 \quad \text{(Equation 13)}$ In the case where $H^7(D)$ has odd terms and $H^6(D)$ has even terms we obtain:

$$P1 \oplus P \neq 0, \text{ hence } P1 \neq 0$$

Consequently, it is possible to identify between even and odd sub-frames. On the other hand, if $H^7(D) \oplus H^6(D)$ has even number of terms, then output $P1=0$ and it is not possible to identify between even and odd frames. Of course, there are numerous other reorganizations of bit groups or changes to individual bit groups or only a subset-defining bit therein by applying, for example, a Boolean algebra function thereto or inversion, which will create the desired alteration to at least the even frames or at least the odd frames. In some cases, merely inverting a single subset-defining bit in one frame will create a sufficient modification.

As previously described with respect to FIG. 1, the bit groups from the bit group organizer 126 are then modulated by multidimensional coded modulation means 35 and sent through the channel 34 to the receiver 80, where the received signal is filtered and demodulated. After detection and correction of synchronization is accomplished by a synchronization detection and correction means 128 (to be described hereinafter), a symbol-synchronizer 130 is used to place each bit group from the even numbered frames into forward order again. This provides a valid bit group sequence which is necessary for proper operation of the Viterbi decoder 104.

Figure 14:
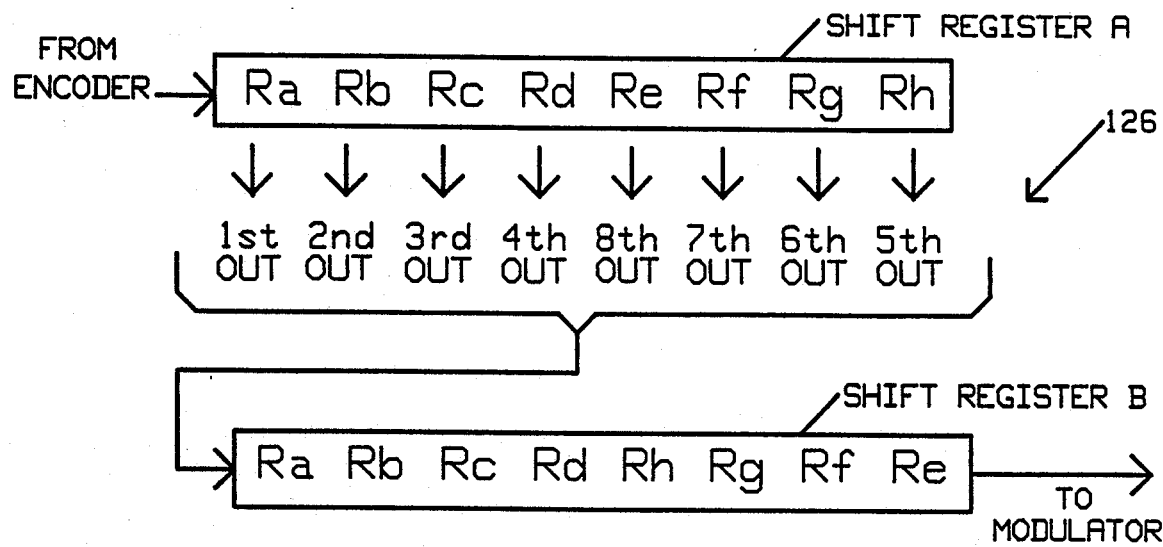
FIG. 14 shows a pair of shift registers of a bit group organizer of the second embodiment.

Referring to FIG. 14, the bit group organizer 126 includes a pair of shift registers A and B. Each of shift registers A and B has the capacity to store sufficient bits so as to store one master frame of the bit groups (subset selecting bits). The symbol organizer 126 stores eight successive bit groups Ra through Rh in the shift register A. The bit groups Ra through Rh are read from shift register A in the order of 1st through 8th as shown and placed into the second shift register B. The eight bit groups in shift register B comprise one master frame which is passed bit group by bit group to the modulator 35.

Figure 15:
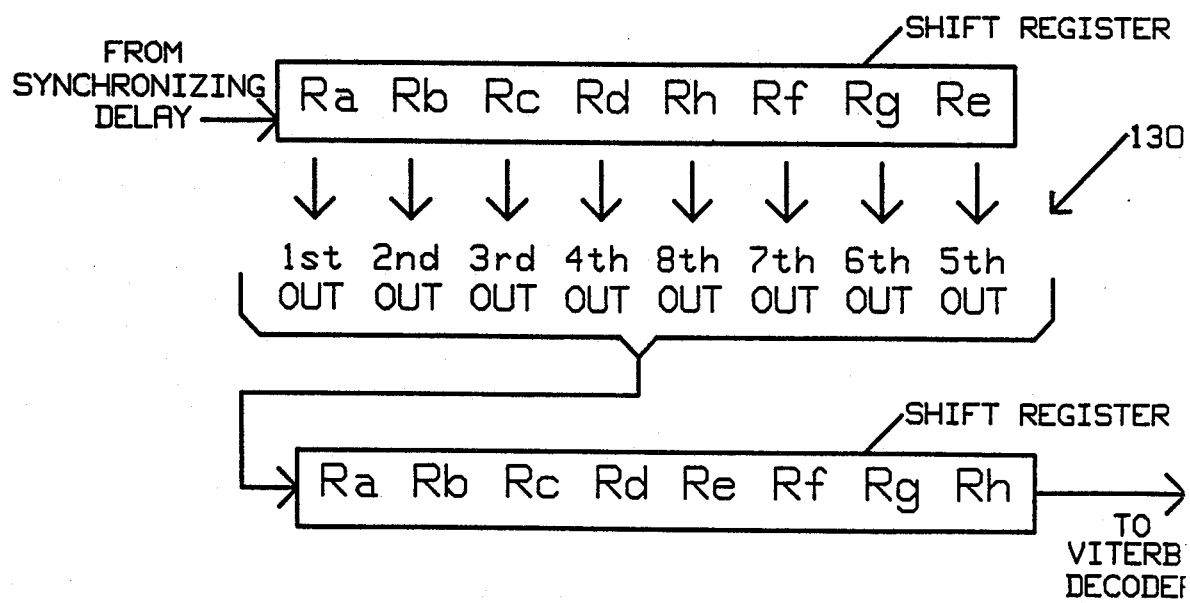
FIG. 15 shows a pair of shift registers of a bit group reorganizer of the second embodiment.

In the receiver 80 of FIG. 13, the bit groups are provided to a synchronizing correction means 132 (to be described hereinafter) and thereafter are provided from the correction means 132 to the bit group reorganizer 130. Referring to FIG. 15, at the bit group reorganizer 130 fills a shift register C with eight successive bit groups. The bit groups are read from shift register C and placed in a second shift register D in the corrected order shown. The bit groups are then passed to the Viterbi decoder 104.

Referring to FIG. 13, the bit group reorganizer 130 must know which of eight receiver bit groups signifies the beginning of each master frame. In cooperation with the reorganization of alternate sub-frames within master frames, this is accomplished by the synchronization detection and correction means 128, which includes the synchronizer 134 and the synchronizing correction means 132.

Figure 16:
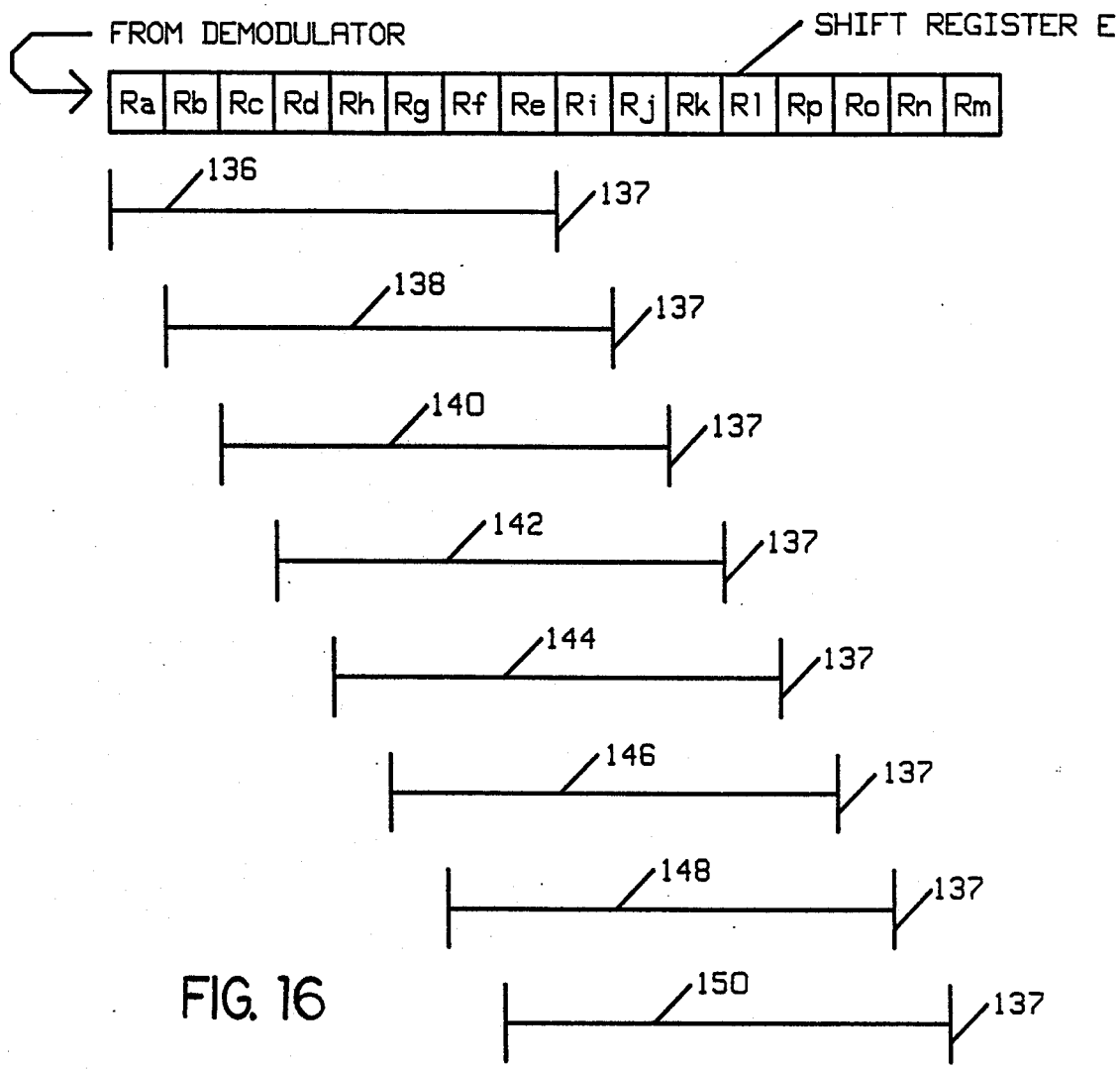
FIG. 16 shows a succession of candidate frames generated from the received bit groups in the receiver.

Referring to FIG. 16, the synchronizer 134 receives a received master frame 136 defined by a window 137, that starts with bit group Ra and ends with bit group Re, with bit group Ra being the most recent bit group received. As with the first embodiment, the defining of one master frame, defines a series of contiguous master frames extending backward into continuously older bit groups. However, for the purposes of illustration in FIG. 16, only the most recent master frame is shown in the series of master frames. Every two group intervals, the synchronizer 134 takes the received master frame 136, assumes that the actual transmitted master frame begins with each of the bit groups within the received master frame 136, so as to generate, as possibilities, eight candidate master frames 136 through 150, thereby defining the moving window 137 having an increasing offset of multiples of one bit group, i.e., one symbol interval. The received frame 136 is one of the eight possible candidate frames.

Figure 17:
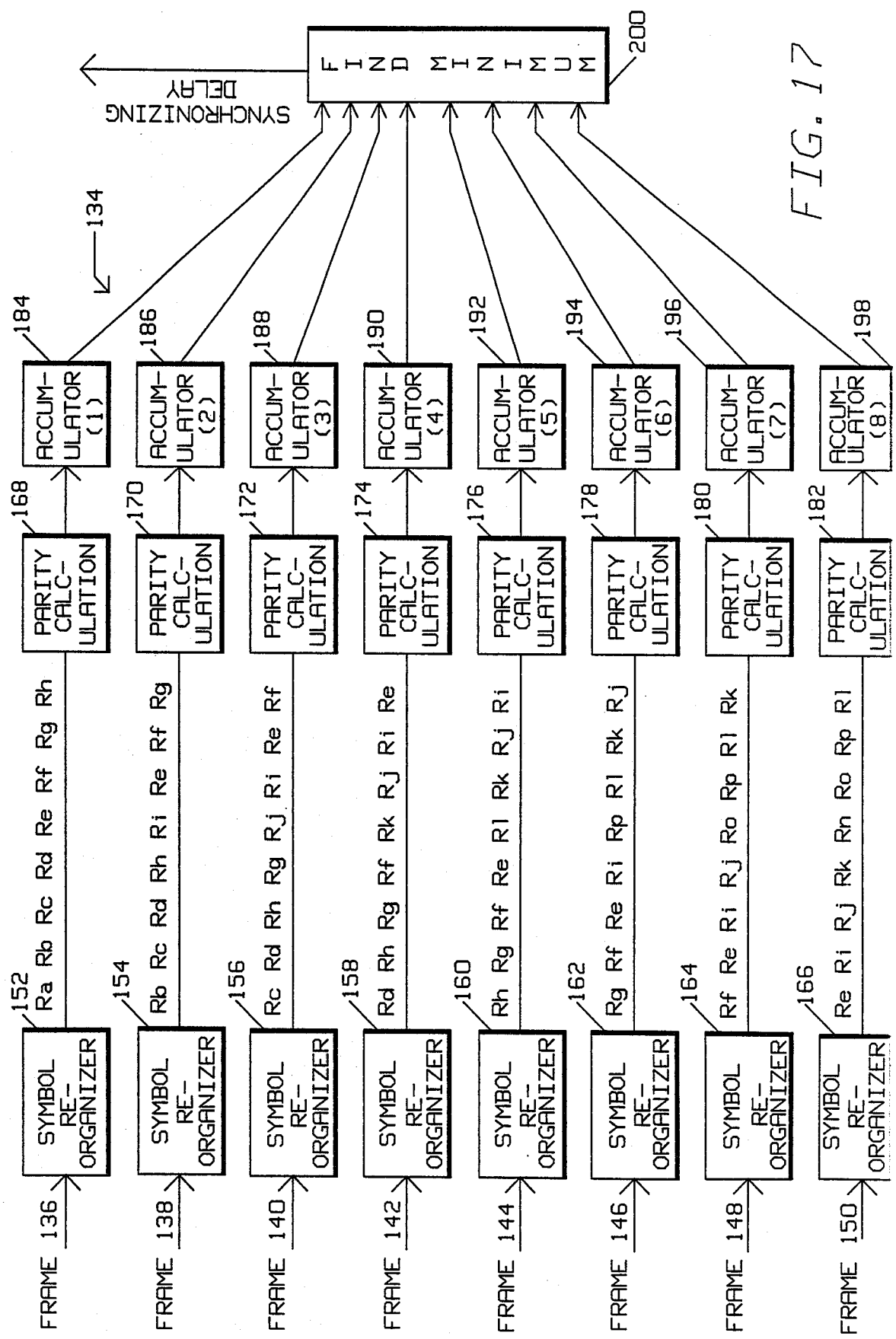
FIG. 17 shows a first implementation of a synchronizer of the receiver of the second embodiment.

Referring to FIG. 17, in a first implementation of synchronization detection and correction means 128, for each of the set of candidate frames 136 through 150, there is a corresponding bit group reorganizer 152 through 166 which receives the candidate frames and reverses the last four bit groups of each candidate master frames. Since this is done for each new master frame, i.e., two group intervals, this is merely a matter of adding another (and most current) candidate master frame to a series of master frames already having the same offset relative to the received master frames as defined by the moving window 137 (only last one shown in FIG. 16). For each candidate window 136 through 150, the bit groups of three and one-half candidate master frames are used in eight calculations shown by blocks 168 through 182 of the parity check Equation 4. Although only one master frame is shown in FIG. 17 for each candidate frame, as previously discussed with the first embodiment, the calculation of Equation 4 requires a series of seven, one group interval consecutive sub-frames, i.e., three and one-half master frams. As with the first embodiment, the results of the calculation of the parity check Equation 4 are accumulated (added) over a plurality of group intervals, e.g., 700, in accumulators 184 through 198, there being one accumulator for each candidate frame. In other words, after all eight accumulators have been updated in this fashion, new bit groups are shifted into the shift Register E each group interval and the process is repeated during each two group intervals, e.g., eight new bit groups in Register E. After the predetermined number of group intervals so as to give a sufficient integration period, for example 350 master frames, i.e., 700 group intervals, the minimum of the eight accumulator values is determined at block 200, which in turn determines which bit group was the beginning of the master frame. The number (shown in FIG. 17) of the accumulator containing this minimum is output from the block 200 and is identified as the "bit group-sync-delay", which is provided to the synchronizing correction means 132 so as to control the amount of synchronizing delay (could also provide an advance) necessary to align the received master frames, prior to being passed on to the frame-reorganizer 130. The synchronizer of FIG. 17 is preferably implemented by way of a computer program. The flow chart for the synchronizer would be identical to that of FIG. 11, except there would be eight "compute P" blocks, eight "accumulate" blocks, and, as shown in FIG. 16, there would be eight bit groups in each frame, and GI is larger, e.g., 700 group intervals.

The synchronizer 134 operates in one of two modes, search mode and lock mode. Search mode occurs when the received line signal is temporarily lost and has since been restored. In search mode, the synchronizer 134 is initiated. Once the synchronizer 134 determines the beginning of the master frame, the bit group-sync-delay value is provided as an output to adjust the synchronizing delay of block 132. The system then switches to lock mode, where the synchronizer 134 is halted, the new bit group-sync-delay value is frozen, and stored as a hold over variable. The synchronizer 134 will remain in lock mode until such time as the received line signal is lost again. Detection of the lost carrier signal is accomplished in a manner well-known in the prior art, such detection being required for normal modem operation.

Figure 18:
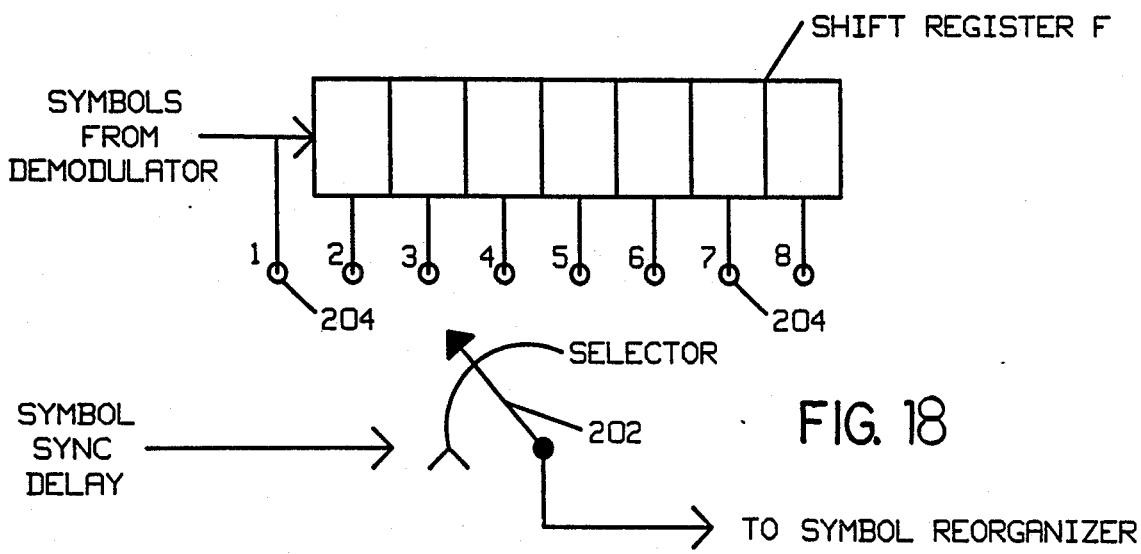
FIG. 18 shows a synchronizing delay of the receiver of the second embodiment.

Referring to FIG. 18, the synchronizing correction means 132 ensures that the master frames are aligned for the bit group-reorganizer 130 to function properly. The bit group-sync-delay is normally fixed at a constant value, for example, so a selector 202 will be set to position one of the eight possible positions or taps 204 along shift register F. In the event synchronizing is lost (one example being during a signal dropout), the synchronizer 134 may determine a new value for the bit group-sync-delay. At this point, the selector 202 is moved to the new tap 204 and operation continues with bit groups arriving at the reorganizer 130 with a different amount of delay than the bit groups (and therefore received master frames) had before synchronism was lost. For the first embodiment, only taps 1 through 4 would be needed.

As will be obvious to those skilled in the art, many other methods and arrangements exist for implementation of the synchronizer 134. For example, in a second implementation (preferred implementation) of the synchronizer 134 the eight-symbol-reorganizers 152 through 166 of FIG. 17 are removed and the parity check Equation 4 is modified to incorporate the rearrangement of the group bits in the even numbered subframes.

Referring to FIG. 13 at the transmitter in the bit group organizer 126, alternate subframes are reorganized as shown in Equations (14) through (16):

$$[\underline{F}_{n-i}] = [\underline{Y}_{n-i}][\underline{C}_1] \quad \text{(Equation 14)}$$

where
$$[\underline{Y}_{n-i}] = (y^7_{n-i}\, y^6_{n-i}\, y^5_{n-i}\, y^4_{n-i}\, y^3_{n-i}\, y^2_{n-i}\, y^1_{n-i}\, y^0_{n-i})$$

$$C_1 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

for $i = 0, 2, 4, 6, 8 \ldots 2k$.

So,
$$[\underline{F}_{n-i}] = [y^1_{n-i}\, y^0_{n-i}\, y^3_{n-i}\, y^2_{n-i}\, y^5_{n-i}\, y^4_{n-i}\, y^7_{n-i}\, y^6_{n-i}] \quad \text{(Equation 15)}$$

and $$[\underline{F}_{n-i}] = [\underline{Y}_{n-i}][\underline{C}_2] \quad \text{(Equation 16)}$$

for $i = 1, 3, 5, 7, 9 \ldots 2k+1$, $$C_2 = \begin{bmatrix} 0 & 0 & 0 & 0 & 0 & 0 & 1 & 0 \\ 0 & 0 & 0 & 0 & 0 & 0 & 0 & 1 \\ 0 & 0 & 0 & 0 & 1 & 0 & 0 & 0 \\ 0 & 0 & 0 & 0 & 0 & 1 & 0 & 0 \\ 0 & 0 & 1 & 0 & 0 & 0 & 0 & 0 \\ 0 & 0 & 0 & 1 & 0 & 0 & 0 & 0 \\ 1 & 0 & 0 & 0 & 0 & 0 & 0 & 0 \\ 0 & 1 & 0 & 0 & 0 & 0 & 0 & 0 \end{bmatrix}$$

from Equation 14 and Equation 16

$$\underline{Y}_{n-i} = [\underline{F}_{n-i}][\underline{C}_1^{-1}] \text{ for } i \text{ even} \quad \text{(Equation 17)}$$

$$\underline{Y}_{n-i} = [\underline{F}_{n-i}][\underline{C}_2^{-1}] \text{ for } i \text{ odd} \quad \text{(Equation 18)}$$

where $\underline{C}_1^{-1} = \underline{C}_1$ and $\underline{C}_2^{-1} = \underline{C}_2$ \quad (Equation 19)

The parity check equation for the original transmitter signal is:

$$P = \underline{Y}_n \{H^7(D) H^6(D) H^5(D) H^4(D) H^3(D) H^2(D) H^1(D) H^0(D)\}^T \quad \text{(Equation 20)}$$

where
$$H^i(D) = H_0^i \oplus H_1^i D \oplus H_2^i D^2 \oplus H_3^i D^3 \oplus H_4^i D^4 \oplus H_5^i D^5 \oplus H_6^i D^6 \quad \text{(Equation 21)}$$

where each $H_j^i$ can either be a 1 or zero. For this particular case the matrix of $\underline{H} = [H_j^i]$ as given by Equation 3 and is shown as follows:

$$\begin{bmatrix} 1 & 1 & 1 & 0 & 0 & 0 & 1 \\ 1 & 0 & 0 & 0 & 1 & 1 & 1 \\ 1 & 1 & 1 & 1 & 1 & 0 & 1 \\ 1 & 1 & 1 & 0 & 0 & 1 & 1 \\ 1 & 0 & 0 & 1 & 0 & 1 & 1 \\ 1 & 0 & 0 & 0 & 1 & 0 & 1 \\ 1 & 1 & 1 & 1 & 1 & 1 & 1 \\ 1 & 0 & 0 & 1 & 0 & 0 & 1 \end{bmatrix} \quad \text{(Equation 22)}$$

So P can be rewritten.

$$P = Y_n(H_0^7 H_0^6 H_0^5 H_0^4 H_0^3 H_0^2 H_0^1 H_0^0)T \oplus \quad \text{(Equation 23)}$$
$$Y_{n-1}(H_1^7 H_1^6 H_1^5 H_1^4 H_1^3 H_1^2 H_1^1 H_1^0)T \oplus$$
$$Y_{n-2}(H_2^7 H_2^6 H_2^5 H_2^4 H_2^3 H_2^2 H_2^1 H_2^0)T \oplus$$
$$Y_{n-3}(H_3^7 H_3^6 H_3^5 H_3^4 H_3^3 H_3^2 H_3^1 H_3^0)T \oplus$$
$$Y_{n-4}(H_4^7 H_4^6 H_4^5 H_4^4 H_4^3 H_4^2 H_4^1 H_4^0)T \oplus$$
$$Y_{n-5}(H_5^7 H_5^6 H_5^5 H_5^4 H_5^3 H_5^2 H_5^1 H_5^0)T \oplus$$
$$Y_{n-6}(H_6^7 H_6^6 H_6^5 H_6^4 H_6^3 H_6^2 H_6^1 H_6^0)T$$

From Equation 17 and Equation 18 substituting for $\underline{F}_{n-1}$ $$P = F_n[C_1^{-1}](H_0^7 H_0^6 H_0^5 H_0^4 H_0^3 H_0^2 H_0^1 H_0^0)T \oplus \quad \text{(Equation 24)}$$
$$F_{n-1}[C_2^{-1}](H_1^7 H_1^6 H_1^5 H_1^4 H_1^3 H_1^2 H_1^1 H_1^0)T \oplus$$
$$F_{n-2}[C_1^{-1}](H_2^7 H_2^6 H_2^5 H_2^4 H_2^3 H_2^2 H_2^1 H_2^0)T \oplus$$
$$F_{n-3}[C_2^{-1}](H_3^7 H_3^6 H_3^5 H_3^4 H_3^3 H_3^2 H_3^1 H_3^0)T \oplus$$
$$F_{n-4}[C_1^{-1}](H_4^7 H_4^6 H_4^5 H_4^4 H_4^3 H_4^2 H_4^1 H_4^0)T \oplus$$
$$F_{n-5}[C_2^{-1}](H_5^7 H_5^6 H_5^5 H_5^4 H_5^3 H_5^2 H_5^1 H_5^0)T \oplus$$
$$F_{n-6}[C_1^{-1}](H_6^7 H_6^6 H_6^5 H_6^4 H_6^3 H_6^2 H_6^1 H_6^0)T$$

Equation (24) can be rewritten as $$P = F_n(H_0^7 H_0^6 H_0^5 H_0^4 H_0^3 H_0^2 H_0^1 H_0^0)T \oplus$$
$$F_{n-1}(H_1^7 H_1^6 H_1^5 H_1^4 H_1^3 H_1^2 H_1^1 H_1^0)T \oplus$$
$$F_{n-2}(H_2^7 H_2^6 H_2^5 H_2^4 H_2^3 H_2^2 H_2^1 H_2^0)T \oplus$$
$$F_{n-3}(H_3^7 H_3^6 H_3^5 H_3^4 H_3^3 H_3^2 H_3^1 H_3^0)T \oplus$$
$$F_{n-4}(H_4^7 H_4^6 H_4^5 H_4^4 H_4^3 H_4^2 H_4^1 H_4^0)T \oplus$$
$$F_{n-5}(H_5^7 H_5^6 H_5^5 H_5^4 H_5^3 H_5^2 H_5^1 H_5^0)T \oplus$$
$$F_{n-6}(H_6^7 H_6^6 H_6^5 H_6^4 H_6^3 H_6^2 H_6^1 H_6^0)T$$

$$= \underline{F}_n[H'^7(D) H'^6(D) H'^5(D) H'^4(D) H'^3(D) H'^2(D) H'^1(D) H'^0(D)]^T \quad \text{(Equation 25)}$$

$$H'^7(D) = H_0^7 \oplus H_1^1 D \oplus H_2^7 D^2 \oplus H_3^1 D^3 \oplus H_4^7 D^4 \oplus H_5^1 D^5 \oplus H_6^7 D^6 \quad \text{(Equation 26a)}$$

$$H'^6(D) = H_0^6 \oplus H_1^0 D \oplus H_2^6 D^2 \oplus H_3^0 D^3 \oplus H_4^6 D^4 \oplus H_5^0 D^5 \oplus H_6^6 D^6 \quad \text{(Equation 26b)}$$

$$H'^5(D) = H_0^5 \oplus H_1^3 D \oplus H_2^5 D^2 \oplus H_3^3 D^3 \oplus H_4^5 D^4 \oplus H_5^3 D^5 \oplus H_6^5 D^6 \quad \text{(Equation 26c)}$$

$$H'^4(D) = H_0^4 \oplus H_1^2 D \oplus H_2^4 D^2 \oplus H_3^2 D^3 \oplus H_4^4 D^4 \oplus H_5^2 D^5 \oplus H_6^4 D^6 \quad \text{(Equation 26d)}$$

$$H'^3(D) = H_0^3 \oplus H_1^5 D \oplus H_2^3 D^2 \oplus H_3^5 D^3 \oplus H_4^3 D^4 \oplus H_5^5 D^5 \oplus H_6^3 D^6 \quad \text{(Equation 26e)}$$

$$H'^2(D) = H_0^2 \oplus H_1^4 D \oplus H_2^2 D^2 \oplus H_3^4 D^3 \oplus H_4^2 D^4 \oplus H_5^4 D^5 \oplus H_6^2 D^6 \quad \text{(Equation 26f)}$$

$$H'^1(D) = H_0^1 \oplus H_1^7 D \oplus H_2^1 D^2 \oplus H_3^7 D^3 \oplus H_4^1 D^4 \oplus H_5^7 D^5 \oplus H_6^1 D^6 \quad \text{(Equation 26g)}$$

$$H'^0(D) = H_0^0 \oplus H_1^6 D \oplus H_2^0 D^2 \oplus H_3^6 D^3 \oplus H_4^0 D^4 \oplus H_5^6 D^5 \oplus H_6^0 D^6 \quad \text{(Equation 26h)}$$

Equation (26) can also be written as:

$$P = \underline{Y}_n[HE(D)]^T \oplus \underline{F}_n[HO(D)]^T \quad \text{(Equation 27)}$$

where
$[HE(D)]^T = [HE^7(D)HE^6(D)HE^5(D)HE^4(D)HE^3(D)HE^2(D)HE^1(D)HE^0(D)]^T$ where $HE^j(D)$ has only even powers of D as follows: $D^0 D^2 D^4 D^6$ and $[HO(D)]^T = [HO^1(D)HO^0(D)HO^3(D)HO^2(D)\ HO^5(D)HO^4(D)HO^7(D)HO^6(D)]^T$ where $HO^j(D)$ has only odd terms.

Figure 19:
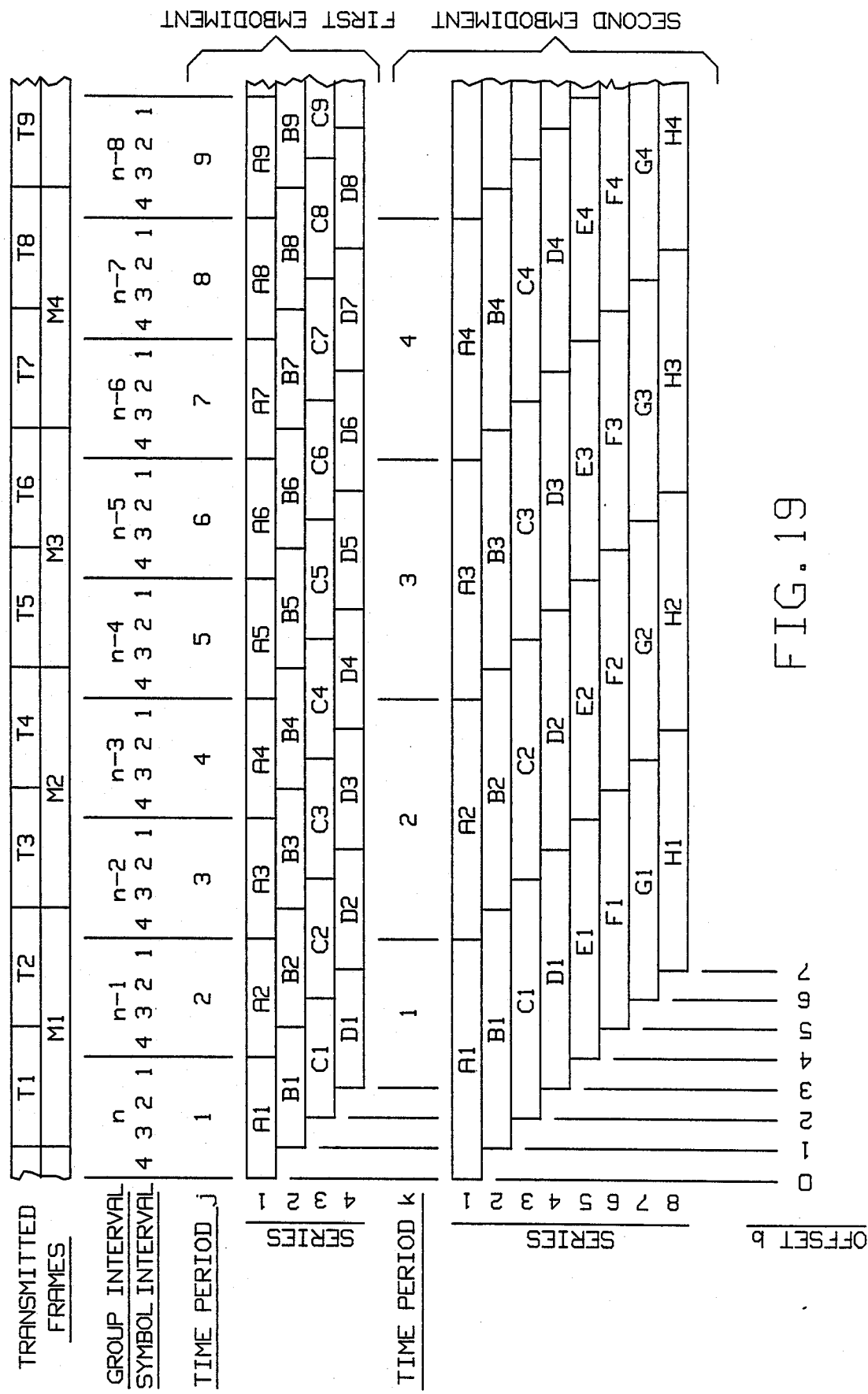
FIG. 19 shows the candidate frames for both embodiments.

In FIG. 19, the first embodiment for the single port modem of FIGS. 9 through 11 and the second embodiment for the mulitport modem of FIGS. 12 through 18 are generalized into a single diagram. For both embodiments, the expanded bit sequences each include q bit groups of subset-selecting bits, with q being 4 in both illustrative embodiments. As they exist in the transmitter, the bit groups of each expanded bit sequence are shown in the diagram by the identifier Tj. Each expanded bit sequence occurs during and is indexed to one of the group intervals. The newest expanded bit sequence Tj is identified as T1 and oldest shown is T9. Each group interval has four symbol intervals with the newest being identified by numeral 4 and oldest being identified by numeral 1.

For the purposes of this generalization and the appended claims, with respect to both embodiments, the bit groups of the expanded bit sequences that are transmitted from the transmitter define "consecutive frames" or "consecutive transmitted frames", with each consecutive frame having m bit groups, where m is equal to 1q in the first embodiment and 2a in the second embodiment (m and q both being integers). Since other embodiments may have other multiples of q, the invention is intended to cover embodiments wherein m=q·i, where i is an integer which is greater than or equal to one. Referring to FIG. 19, the consecutive transmitted frames are identified by values of Tj (same as expanded bit sequences) for the first embodiment and by values of M for the second embodiment.

The two embodiments are illustrated with received frames A (Aj in first embodiment and Ak in second embodiment) of bit groups. The received frames are illustrated with an error of a single symbol interval, i.e., there is an offset of one symbol interval from the transmitted consecutive frames Tj and Mk of the first and second embodiments, respectively. Each received frame has the same number of bit groups as its corresponding consecutive transmitted frame. For the first embodiment, each received fame Aj is indexed to a time period j that is the same as a group interval. For the second embodiment, each received frame Ak is indexed to a time period k that is the same as 2 group intervals.

According to the invention, there is generated for and indexed to each time period (j in first embodiment and k in second embodiment) a "set" of m "candidate frames", with the number of candidate frames in each such set being equal in number to the number of bit groups in each transmitted consecutive frame. For the first and second embodiments, this number is four and eight, respectively. Referring to the diagram, each candidate frame is identified by a letter and a number corresponding to the number identifying the time period to which candidate frame is indexed, e.g., for the second embodiment, there are eight candidate frames A1 through H1 indexed to time period 1. For each time period, the set includes the received frame A and m−1 successive candidate frames (B through D for the first embodiment and B through H for the second embodiment), with each successive candidate frame being offset from the previous candidate frame by one symbol interval, i.e., bit group. In other words, the m−1 successive frames are successively offset from the received candidate frame by an increasing integer number b, where $1 \leq b \leq m-1$, until the last one of said symbol interval of the received frame becomes the first symbol interval of the last one of the m−1 frames, e.g., symbol interval 1 of time period 1 is the last symbol interval in frame A1, but the first symbol interval in frame D1.

All the candidate frames in the same row in FIG. 19 define a "series" of candidate frames, with each one of the frames of the series being indexed to successively earlier time periods. As previously discussed, for both embodiments, each parity check calculation requires seven group intervals of frames from one of the series, e.g., for the first parity check equation calculation for the first embodiment, frames A1 through A7 are used.

In the illustrative example, the parity check equation would be calculated for all four series in the first embodiment each time period, i.e., group interval, and for all eight series in the second embodiment each time period, i.e., 2 group interval. The outputs for each series is accumulated over a plurality of calculations for each series, until a decision is made. In both embodiments, there series "2" (as shown in FIG. 19) would be selected.

Although particular embodiments of the invention have been shown and described here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

I claim:

1. In a modulation-demodulation system including a transmitter having a convolutional encoder for transforming digital information bits into a plurality of expanded bit sequences with each of said expanded bit sequences having a plurality of symbol-selecting bits and a plurality of bit groups of subset-selecting bits, said bit groups of said expanded bit sequences defining a plurality of consecutive frames of said bit groups and said transmitter further having multidimensional coded modulation means coupled to said convolutional encoder to receive said expanded bit sequences, said multidimensional coded modulation means being responsive to each said expanded bit sequence for selecting during each of a plurality of group intervals a multidimensional symbol from a multidimensional symbol subset, said multidimensional symbol being composed of a plurality of 2-dimensional symbols, each of said group intervals including a plurality of symbol intervals, and said multidimensional coded modulation means being operable for generating a modulated carrier signal by modulating a carrier signal with one of said 2-dimensional symbols during each of said symbol intervals and for transmitting said modulated carrier signal over a transmission medium; and said system further including a receiver having demodulation means for receiving said modulated carrier signal from said transmission medium and for demodulating said modulated carrier signal to obtain a baseband signal and slicer means coupled to said demodulation means to receive said baseband signal, said slicer means being operable for obtaining from said baseband signal one of said bit groups of said subset-selecting bits for each of said symbol intervals, the improvement in said receiver comprising:

synchronizer means including window means coupled to said slicer means to receive said bit groups, said window means being operative for grouping said bit groups into a plurality of sets of candidate frames with there being one of said sets of said candidate frames for each of a plurality of successive time periods and with each of said candidate frames having the same number of said bit groups as each of said consecutive frames of said transmitter, said candidate frames of each said set including a received frame and a plurality of successive said candidate frames with each said successive candidate frame having an offset from a previous said candidate frame of one of said bit goups so that said each set has a number of said candidate frames equal to said number of said bit groups in each of said candidate frames, said candidate frames of said plurality of successive time periods having a same said offset define one of a plurality of series of said candidate frames;

said synchronizer means further including parity check means coupled to said window means to receive said series of candidate frames, said parity check means being operable for repeatedly calculating an output for each of said series of candidate frames using a parity check equation; and said synchronizer means further including comparator means coupled to said parity check means to receive said outputs therefrom, said comparator means being operable for comparing said outputs of said parity check means for each of said series of candidate frames over a number of said time periods and for selecting one of said series of candidate frames which gives one of said outputs indicative of synchronization with said consecutive frames of said transmitter.

2. The modulation-demodulation system according to claim 1, wherein said parity check equation comprises:

$$P_n = [\hat{y}_n^r \ldots \hat{y}_n^1, \hat{y}_n^0] \times [H^r(D) \ldots H^1(D), H^0(D)]^T$$

where $P_n$ is said output for one of said series, where $H(D)$ is a parity check matrix which is shown as a function of a delay operator D and which has r terms, where $y_n$'s are said subset-selecting bits of said one series for a given one of said group intervals n, and where T means transpose; and wherein each said calculation using said parity check equation requires use of a number of said subset-selecting bits from one of said series of said candidate frames beginning with one of said candidate frames which includes said subset-selecting bits of said group interval n.

3. The modulation-demodulation system according to claim 2, wherein said comparator means includes accumulator means for accumulating said outputs for each of said series of candidate frames over said number of said time periods.

4. The modulation-demodulation system according to claim 2, wherein said selected series is in synchronization with said consecutive frames of said transmitter when said consecutive frames of said transmitter and said candidate frames of said selected series start with the same one of said symbol intervals within any given one of said group intervals.

5. The modulation-demodulation system according to claim 1, further comprising:

synchronization correction means coupled to said synchronizer means for correcting synchronization of said bit groups in response to said comparator means determining that said selected series of candidate frames differs in timing from said received frame.

6. The modulation-demodulation system according to claim 1, wherein the number of said bit groups in each one of said consecutive frames of said transmitter is a multiple of the number of said bit groups in each of said expanded bit sequences and an integer of at least one and the number of said group intervals in each one of said time periods is an integer of at least one.

7. The modulation-demodulation system according to claim 1, wherein each of said consecutive frames of said transmitter and each of said candidate frames have the same number of said bit groups as each of said expanded bit sequences.

8. The modulation-demodulation system according to claim 1, wherein said consecutive frames provided by said transmitter and said candidate frames provided by said receiver each include a pair of sub-frames of said bit groups from a pair of consecutive said expanded bit sequences, thereby defining alternate even and odd said sub-frames with each of said consecutive and said candidate frames having one of said even sub-frames and one of said odd sub-frames, each of said time periods consisting of two of said group intervals.

9. The modulation-demodulation system according to claim 8, wherein said transmitter includes means coupled to said convolutional encoder for introducing at least an alteration to said subset-defining bits of every other said sub-frame to differentiate alternate said sub-frames, synchronization correction means coupled to said synchronizer means for correcting synchronization in response to said comparator means determining that said selected series of candidate frames differs in timing from said received frame, and reorganizing means in said receiver for receiving said sub-frame having said alternation and for removing said alteration.

10. The modulation-demodulation system according to claim 9, wherein said alterations to said altered sub-frames are capable of causing a first parity check equation to provide a non-zero output when applied to said sub-frames and the absence of said alterations to said sub-frames are capable of causing said first parity check equation to provide only a zero output.

11. The modulation-demodulation system according to claim 10, wherein said parity check equation applied to said series of candidate frames comprises a second parity check equation, for giving said output substantially only a zero output when one of said series of candidate frames is in synchronization with said transmitted frames.

12. The modulation-demodulation system according to claim 11, wherein said second parity check equation anticipates said alternation to occur within a predetermined position within said candidate frames, said selected series of candidate frames having the only said candidate frames with said alterations in said predetermined position.

13. The modulation-demodulation system according to claim 12, wherein said first parity check equation comprises:

$$P_{n1}=[\underline{Y}_n][HE(D)]^T$$

where $P_{n1}$ is said zero or non-zero outputs for said first parity check equation, $\underline{Y}_n$ is a matrix of said subset-defining bits of a most current said sub-frame for one of said series at said group interval n, where HE(D) is a parity check matrix designed without said alteration being anticipated in each said frame to which said parity check matrix is applied and where T means transpose and wherein said second parity equation comprises:

$$P_{n2}=[\underline{Y}_n][HE(D)]^T+[\underline{F}_n][HO(D)]^T$$

wherein $P_{n2}$ is said output of said second parity check equation, $[\underline{Y}_n][HE(D)]^T$ is applied to said unaltered sub-frames and $[\underline{F}_n][HO(D)]^T$ is applied to said altered sub-frames and is a parity check matrix designed with and alteration being anticipated in each said subframe to which said parity check matrix is applied, $\underline{Y}_n$ is a matrix of said subset-defining bits of said unaltered sub-frame for one of said series at said group interval n, $\underline{F}_n$ is a matrix of said subset-defining bits of said altered sub-frame having said alteration for one of said series at said group interval n.

14. The modulation-demodulation system according to claim 13, wherein said means for introducing said alteration reverses the order of at least two of said bit groups in each of said altered sub-frames.

15. The modulation-demodulation system according to claim 9, wherein reorganizing means comprises said window means having a bit group reorganizer for performing the inverse of said alteration of said transmitter for each of said candidate frames.

16. In a modulation-demodulation system including a transmitter having a convolutional encoder for transforming digital data into a plurality of expanded bit sequences, each said expanded bit sequence having subset-selecting bits defining q bit groups and having symbol-selecting bits, said bit groups of said expanded bit sequences being organized in consecutive transmitted frames wherein there are m bit groups in each of said transmitted frames with m being equal to q multiplied by an integer i, where $i \geq 1$, and said transmitter further having modulation means in communication with said convolutional encoder for receiving said expanded bit sequences and for being responsive to each of said expanded bit sequences for selecting one 2-dimensional symbol for each said bit group and for generating for each one of a plurality of symbol intervals a modulated carrier signal by modulating a carrier signal with one of said 2-dimensional symbols and for transmitting said modulated carrier signal over a transmission medium, and said system further including a receiver having demodulation means for receiving said modulated carrier signal from said transmission medium and for demodulating said modulated carrier signal to obtain a baseband signal; slicer means in communication with said demodulation means for receiving said baseband signal and for obtaining a plurality of received said bit groups from said baseband signal, there being one said received bit group for each one of said symbol intervals; the improvement comprising:

defining means in communication with said slicer means for receiving said received bit groups and for defining a plurality of received frames of m said received bit groups;

forming means in communication with said defining means for receiving said received frames and for forming m candidate frames of m said received bit groups wherein said m candidate frames include one of said received frames and another m-1 frames with each being successively offset from said one received frame by an increasing integer number b of said symbol intervals (where $1 \leq b \leq m-1$) until a last one of said symbol intervals of said received frame becomes a first one of said symbol intervals of a last one of said m-1 frames;

calculating means in communication with said forming means for receiving said m candidate frames and for calculating an output for each of said m candidate frames using a parity check equation having as input thereto for each said calculation a series of contiguous frames beginning with one of said candidate frames; and comparing means in communication with said calculating means for receiving said outputs and for comparing said outputs of said means for calculating to determine synchronization between said transmitted frames and said received frames.

17. The modulation-demodulation system of claim 16, wherein m is equal to q and i is equal to one and said transmitter has each of said expanded sequences occurring during a group interval, said group interval including a predetermined number of said symbol intervals, said calculating means including means for calculating said parity check equation for each of said q frames during each of a plurality of said group intervals and wherein said comparing means includes means for accumulating said outputs for each of said q frames over said plurality of said group intervals to provide an accumulated output for each of said q frames and means for comparing said accumulated outputs.

18. The modulation-demodulation system according to claim 17, wherein said parity check equation comprises:

$$P_n=[\hat{y}_n^r \ldots \hat{y}_n^1, \hat{y}_n^0] \times [H^r(D) \ldots H^1(D), H^0(D)]^T$$

where $P_n$ is said output of said parity check equation, H(D) is the parity check matrix with r terms which is shown as a function of a delay operator D, $y_n$'s are the subset-defining bits for the nth group interval, and T means transpose.

19. The modulation-demodulation system according to claim 17, wherein q is equal to four and r is equal to eight and said bit groups each have two said subset-selecting bits.

20. The modulation-demodulation system of claim 17, wherein m is equal to 2q and i is equal to 2 and said transmitter has each of said expanded sequences occurring during a group interval, said group interval including a predetermined number of said symbol intervals, said calculating means including means for calculating said parity check equation for each of said m frames during each pair of group intervals and wherein said means comparing includes means for accumulating said outputs for each of said m frames to provide an accumulated output for each of said m frames and means for comparing said accumulated outputs.

21. The modulation-demodulation system according to claim 20, wherein q is equal to four and said bit groups each have two said subset-selecting bits.

22. The modulation-demodulation system according to claim 20, wherein said transmitter includes bit group modifying means in communication with said convolutional encoder for changing in said transmitter at least one of said subset-selecting bits of each said transmitted frame and means for correcting synchronization in response to said comparator means determining one of said candidate frames other than said received frame is in synchronization with said transmitted frames so that at least said received frames received at a point in time subsequent to said determination of synchronization assume the synchronization of said selected candidate frames, means in communication with said synchronization correcting means for receiving said synchronization correct received frames and for removing said modification thereto which was introduced in said transmitter.

23. The modulation-demodulation system according to claim 22, wherein said modifying means interchanges the order of said bit groups in at least two of said symbol intervals included therein.

24. In a modulation-demodulation method including the steps of convolutionally encoding information bit sequences to obtain a plurality of expanded bit sequences with each said expanded bit sequence having a plurality of q bit groups of subset-selecting bits and having symbol-selecting bits; defining said bit groups of said expanded bit sequences to form consecutive transmitted frames wherein there are m bit groups in each of said transmitted frames with m being equal to q multiplied by i, where $i \geq 1$; selecting in response to each of said expanded bit sequences one 2-dimensional symbol from a subset of 2-dimensional symbols defined by one of said bit groups; modulating each symbol interval a carrier signal by said selected 2-dimensional symbol to provide a modulated signal; transmitting over a transmission medium said modulated signal; and demodulating a received modulated signal to produce a demodulated signal; generating a plurality of received bit groups from said demodulated signal; wherein the improvement at the receiver comprises:

forming m candidate frames of said received bit groups with each of said candidate frames including at least one of said symbol intervals found in all the other m−1 candidate frames of said m candidate frames and excluding at least one of said symbol intervals found in the other m-1 candidate frames of said m candidate frames, and repeatedly calculating a parity check equation m times using for an input thereto for each of said m calculation a series of successive frames beginning with a unique one of said m candidate frames and using the outputs of said parity check equation calculation for determining synchronization between the said transmitted frames and one of said candidate frames.

25. The modulation-demodulation method according to claim 24, wherein said parity check equation comprises:

$$P_n = [\hat{y}_n{}^r \ldots \hat{y}_n{}^1, \hat{y}_n{}^0] \times [H^r(D), \ldots H^1(D), H^0(D)]^t$$

where H(D) is the parity check matrix which is a function of the delay operator D, $y_n$'s are said subset-selecting bits and are r in number, and T means transpose.

26. The modulation-demodulation method according to claim 24, wherein said consecutive transmitted frames provided by said transmitter and said candidate frames provided by said receiver each include a pair of sub-frames of said received bit groups from a pair of consecutive said expanded bit sequences, thereby defining alternate even and odd said sub-frames with each of said consecutive and said candidate frames having one of said even sub-frames and one of said odd sub-frames.

27. The modulation-demodulation system according to claim 26, further including the steps of introducing in said transmitter at least an alteration to said subset-defining bits of every other said sub-frame to differentiate alternate said sub-frames, correcting synchronization in the receiver in response to determining that a selected candidate frame differs in timing from said received frame, removing in said receiver said alterations from said sub-frames having said alterations.

* * * * *